United States Patent
Price et al.

(10) Patent No.: US 11,614,480 B2
(45) Date of Patent: Mar. 28, 2023

(54) SYSTEM AND METHOD FOR Z-PAT DEFECT-GUIDED STATISTICAL OUTLIER DETECTION OF SEMICONDUCTOR RELIABILITY FAILURES

(71) Applicant: KLA Corporation, Milpitas, CA (US)

(72) Inventors: David W. Price, Austin, TX (US); Robert J. Rathert, Mechanicsville, VA (US); Chet V. Lenox, Lexington, TX (US); Oreste Donzella, San Ramon, CA (US); John Charles Robinson, Austin, TX (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 17/364,221

(22) Filed: Jun. 30, 2021

(65) Prior Publication Data

US 2022/0390506 A1    Dec. 8, 2022

Related U.S. Application Data

(60) Provisional application No. 63/208,014, filed on Jun. 8, 2021.

(51) Int. Cl.
*G01R 31/28* (2006.01)
*H01L 21/66* (2006.01)

(52) U.S. Cl.
CPC .......... *G01R 31/2831* (2013.01); *H01L 22/12* (2013.01); *H01L 22/30* (2013.01)

(58) Field of Classification Search
CPC ...... G01R 31/2831; H01L 22/12; H01L 22/30
See application file for complete search history.

(56) References Cited

U.S. PATENT DOCUMENTS

| | | | |
|---|---|---|---|
| 10,761,128 B2 | 9/2020 | Price et al. | |
| 2011/0071782 A1 | 3/2011 | Nahar et al. | |
| 2014/0097863 A1 | 4/2014 | Zundel et al. | |
| 2018/0275189 A1* | 9/2018 | Price | G06F 17/18 |
| 2018/0328868 A1 | 11/2018 | Bykanov et al. | |
| 2019/0295908 A1* | 9/2019 | Rathert | H01L 22/20 |
| 2020/0026819 A1 | 1/2020 | Leu et al. | |
| 2020/0312778 A1 | 10/2020 | Lim et al. | |
| 2021/0215753 A1* | 7/2021 | Price | G01R 31/2831 |

OTHER PUBLICATIONS

Search Report and Written Opinion in International Application No. PCT/US2022/031854 dated Sep. 27, 2022, 7 pages.

* cited by examiner

*Primary Examiner* — Jermele M Hollington
*Assistant Examiner* — Suresh K Rajaputra
(74) *Attorney, Agent, or Firm* — Suiter Swantz pc llo

(57) ABSTRACT

A system and method for Z-PAT defect-guided statistical outlier detection of semiconductor reliability failures includes receiving electrical test bin data with semiconductor die data for a plurality of wafers in a lot generated by a statistical outlier detection subsystem configured to perform Z-direction Part Average Testing (Z-PAT) on test data generated by an electrical test subsystem after fabrication of the plurality of wafers in the lot, receiving characterization data for the plurality of wafers in the lot generated by a semiconductor fab characterization subsystem during the fabrication of the plurality of wafers in the lot, determining a statistical correlation between the electrical test bin data and the characterization data at a same x, y position on each of the plurality of wafers in the lot, and locating defect data signatures on the plurality of wafers in the lot based on the statistical correlation.

29 Claims, 11 Drawing Sheets

SYSTEM AND METHOD FOR Z-PAT DEFECT-GUIDED STATISTICAL OUTLIER DETECTION OF SEMICONDUCTOR RELIABILITY FAILURES

CROSS-REFERENCE TO RELATED APPLICATIONS

The present application claims priority to U.S. Provisional Application Ser. No. 63/208,014, filed on Jun. 8, 2021, which is incorporated herein by reference in the entirety.

TECHNICAL FIELD

The present disclosure relates generally to semiconductor devices and, more particularly, to a system and method for Z-direction Part Average Testing (Z-PAT) defect-guided statistical outlier detection of semiconductor reliability failures.

BACKGROUND

Fabrication of semiconductor devices may typically require hundreds or thousands of processing steps to form a functioning device. Over the course of these processing steps, various characterization measurements (e.g., inspection and/or metrology measurements) may be performed to identify defects and/or monitor various parameters on the devices. Electrical testing may be performed instead of or in addition to the various characterization measurements to verify or assess the functionality of the device. However, while some detected defects and metrology errors may be so significant as to clearly indicate a device failure, lesser variations may cause early reliability failures of the device after exposure to a working environment. Risk-averse users of semiconductor devices (e.g., such as automotive, military, aeronautical and medical applications) are now looking for failure rates in the parts-per-billion (PPB) range, exceeding current parts-per-million (PPM) levels. Evaluating the reliability of semiconductor dies is key to meeting these industry requirements as the need for semiconductor devices in automotive, military, aeronautical, and medical applications continues to increase. Therefore, it may be desirable to provide systems and methods for reliability defect detection.

SUMMARY

A system is disclosed, in accordance with one or more embodiments of the present disclosure. In one illustrative embodiment, the system includes a controller communicatively coupled to at least a semiconductor fab characterization subsystem. In another illustrative embodiment, the controller includes one or more processors configured to execute program instructions causing the one or more processors to receive electrical test bin data via a defect-guided correlation subsystem. In another illustrative embodiment, the electrical test bin data includes semiconductor die data for a plurality of wafers in a lot. In another illustrative embodiment, the electrical test bin data is generated by a statistical outlier detection subsystem configured to perform Z-direction Part Average Testing (Z-PAT) on test data. In another illustrative embodiment, an electrical test subsystem is configured to generate the test data by testing the plurality of wafers in the lot after fabrication by the semiconductor fab characterization subsystem. In another illustrative embodiment, the controller includes one or more processors configured to execute program instructions causing the one or more processors to receive characterization data via the defect-guided correlation subsystem. In another illustrative embodiment, the characterization data for the plurality of wafers in the lot is generated by the semiconductor fab characterization subsystem during the fabrication of the plurality of wafers in the lot. In another illustrative embodiment, the controller includes one or more processors configured to execute program instructions causing the one or more processors to determine a statistical correlation between the electrical test bin data and the characterization data via the defect-guided correlation subsystem at a same x, y position on each of the plurality of wafers in the lot. In another illustrative embodiment, the controller includes one or more processors configured to execute program instructions causing the one or more processors to locate defect data signatures on the plurality of wafers in the lot based on the statistical correlation via the defect-guided correlation subsystem.

A method is disclosed, in accordance with one or more embodiments of the present disclosure. In one illustrative embodiment, the method may include, but is not limited to, receiving electrical test bin data via a defect-guided correlation subsystem. In another illustrative embodiment, the electrical test bin data includes semiconductor die data for a plurality of wafers in a lot. In another illustrative embodiment, the electrical test bin data is generated by a statistical outlier detection subsystem configured to perform Z-direction Part Average Testing (Z-PAT) on test data. In another illustrative embodiment, an electrical test subsystem is configured to generate the test data by testing the plurality of wafers in the lot after fabrication by a semiconductor fab characterization subsystem. In another illustrative embodiment, the method may include, but is not limited to receiving characterization data via the defect-guided correlation subsystem. In another illustrative embodiment, the characterization data for the plurality of wafers in the lot is generated by the semiconductor fab characterization subsystem during the fabrication of the plurality of wafers in the lot. In another illustrative embodiment, the method may include, but is not limited to, determining a statistical correlation between the electrical test bin data and the characterization data via the defect-guided correlation subsystem at a same x, y position on each of the plurality of wafers in the lot. In another illustrative embodiment, the method may include, but is not limited to locating defect data signatures on the plurality of wafers in the lot based on the statistical correlation via the defect-guided correlation subsystem.

A system is disclosed, in accordance with one or more embodiments of the present disclosure. In one illustrative embodiment, the system includes a semiconductor fab characterization subsystem. In another illustrative embodiment, the semiconductor fab characterization subsystem is configured to fabricate a plurality of wafers in a lot. In another illustrative embodiment, the semiconductor fab characterization subsystem is configured to generate characterization data for the plurality of wafers in the lot during the fabrication of the plurality of wafers in the lot. In another illustrative embodiment, the system includes an electrical test subsystem. In another illustrative embodiment, the electrical test subsystem is configured to generate test data for the plurality of wafers in the lot after fabrication by the semiconductor fab characterization subsystem. In another illustrative embodiment, the system includes a controller communicatively coupled to at least the semiconductor fab characterization subsystem. In another illustrative embodiment, the controller includes one or more processors configured to execute program instructions causing the one or more processors to receive electrical test bin data via a defect-guided correlation subsystem. In another illustrative embodiment, the electrical test bin data includes semiconductor die data for the plurality of wafers in the lot. In another illustrative embodiment, the electrical test bin data is generated by a statistical outlier detection subsystem configured to perform Z-direction Part Average Testing (Z-PAT). In another illustrative embodiment, the controller includes one or more processors configured to execute program instructions causing the one or more processors to receive the characterization data via the defect-guided correlation subsystem. In another illustrative embodiment, the controller includes one or more processors configured to execute program instructions causing the one or more processors to determine a statistical correlation between the electrical test bin data and the characterization data via the defect-guided correlation subsystem at a same x, y position on each of the plurality of wafers in the lot. In another illustrative embodiment, the controller includes one or more processors configured to execute program instructions causing the one or more processors to locate defect data signatures on the plurality of wafers in the lot based on the statistical correlation via the defect-guided correlation subsystem.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which.

DETAILED DESCRIPTION

Figure 1:
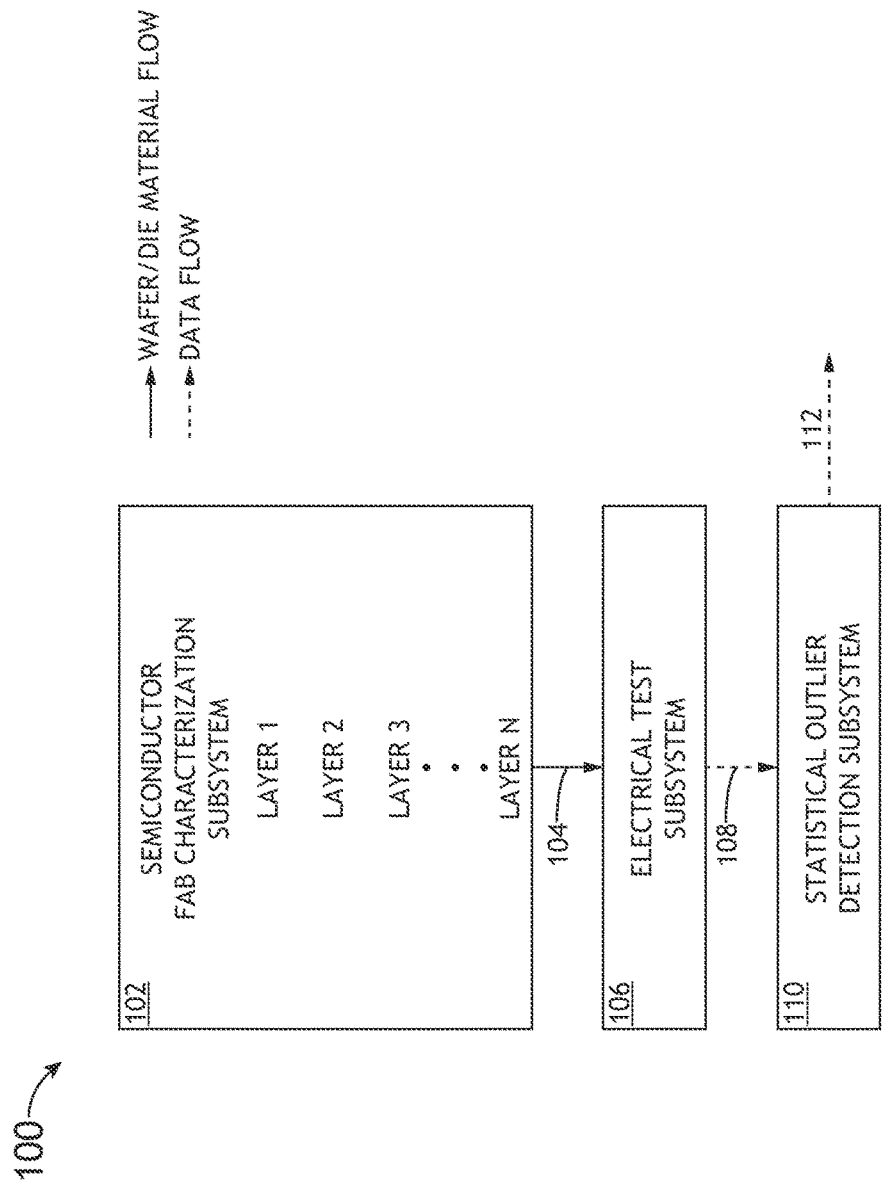
FIG. 1 is a block diagram view of a system for detection of semiconductor reliability failures, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Fabrication of semiconductor devices may typically require hundreds or thousands of processing steps to form a functioning device. Over the course of these processing steps, various characterization measurements (e.g., inspection and/or metrology measurements) may be performed to identify defects and/or monitor various parameters on the devices. Electrical testing may be performed instead of or in addition to the various characterization measurements to verify or assess the functionality of the device.

However, while some detected defects and metrology errors may be so significant as to clearly indicate a device failure, lesser variations may cause early reliability failures of the device after exposure to a working environment. Defects arising during the manufacturing process may have a wide range of impacts on the performance of the device in the field. For example, "killer" defects occurring in known or unknown locations within designs may result in immediate device failure. For instance, killer defects in unknown locations may be particularly problematic where they have a susceptibility to reliability escapes in test gaps, where a semiconductor device may be functionally dead after processing but the device maker is unable to make this determination due to limitations in testing. By way of another example, minor defects may have little or no impact on the performance of the device throughout the device lifetime. By way of another example, a class of defects known as latent reliability defects (LRD) may not lead to failure during manufacturing/testing or may not lead to immediate device failure during operation, but may lead to early-life failure of the device during operation when used in a working environment. It is noted herein the terms "manufacturing process" and "fabrication process" may be considered equivalent, along with respective variants of the terms (e.g., "manufacturing line" and "fabrication line", and the like), for purposes of the present disclosure.

Risk-averse users of semiconductor devices (e.g., such as automotive, military, aeronautical and medical applications) are now looking for failure rates in the parts-per-billion (PPB) range, exceeding current parts-per-million (PPM)

levels. Evaluating the reliability of semiconductor dies and identifying sources of reliability failures is key to meeting these industry requirements as the need for semiconductor devices in automotive, military, aeronautical, and medical applications continues to increase.

Semiconductor devices in quality critical roles may undergo electrical testing, both during wafer sort and again at final test after singulation and packaging. In addition, semiconductor devices may be subjected to methodologies configured to determine systematic defectivity that occurs at a same x, y location on multiple wafers in a given lot. In conventional semiconductor wafer processing methodologies, an x and y dimension localizes the die position on a wafer while a z dimension refers to individual wafers which are stacked on top of each other in a wafer cassette.

Part average testing (PAT) has been adopted by most automotive semiconductor companies, primarily to help them meet the stringent requirements of the automotive industry and, increasingly, high end mobile devices. Reliability studies have shown that semiconductor parts that have abnormal electrical characteristics tend to be higher contributors to long-term quality and reliability problems. For example, devices that originally passed all manufacturing tests but could be considered "outliers" compared to other parts in the same population may be more likely to fail in the field. PAT methodologies proactively identify these outliers for exclusion from production shipments.

PAT methodologies may include, but are not limited to, Geographical Part Average Testing (G-PAT) (e.g., which involves testing a good die in a bad area), Parametric Part Average Testing (P-PAT) (e.g., which involves a parametric signal outside a threshold or norm but within specification limits), Composite Part Average Testing (C-PAT) (e.g., which involves numerous repairs on a die), Inline Defect Part Average Testing (I-PAT), and Z-direction Part Average Testing (Z-PAT). It is noted herein systems and methods for I-PAT are described in United States Patent Publication No. US 2018/0328868 A1, published Nov. 15, 2018. In addition, it is noted herein systems and methods for I-PAT are described in U.S. Pat. No. 10,761,128, issued Sep. 1, 2020, as well as U.S. application Ser. No. 17/101,856, filed Nov. 23, 2020, both of which are incorporated herein in the entirety.

Z-PAT involves part average testing in the z-direction, and has traditionally relied exclusively on test data. Semiconductor suppliers may ink out dies that electrically test 'good' if the same x, y position tests bad on multiple wafers within the same lot. This inking out, or "overkill", is based on the observation many systematic factors that render quality problems at specific locations on the wafer are frequently repeated for those die locations on every wafer in the lot.

In one non-limiting example, a particle stuck to the chuck of the wafer processing tool may result in a consistently elevated protrusion on the front side at that location. In another non-limiting example, an etch process "dead center" issue may include the die at the very center of the wafer being consistently under-etched. In another non-limiting example, a process tool may be consistently depositing particles at a specific position around the edge of the wafer. It is noted herein the above examples are illustrative, and not intended to be limiting with respect to wafer location systematic issues.

FIG. 1 illustrates a system 100 for detection of semiconductor reliability failures, in accordance with one or more embodiments of the present disclosure.

In some embodiments, the system 100 includes a Semiconductor Fab Characterization subsystem 102. The Semiconductor Fab Characterization subsystem 102 may include a plurality of characterization tools configured to perform characterization measurements on semiconductor devices (e.g., semiconductor wafers 104, or wafers 104, for purposes of the present disclosure) within a lot. For example, the plurality of characterization tools may include, but are not limited to, one or more inline defect inspection tools and/or metrology tools configured to characterize the semiconductor devices. By way of another example, the characterization measurements may include, but are not limited to, inline defect inspection measurements and/or metrology measurements. For instance, the inspection measurements may include baseline inspections (e.g., sampling-based inspections), screening inspections at key semiconductor device layers, or the like. For purposes of the present disclosure, "characterization" may refer to either inline defect inspection or inline metrology measurements. It is noted herein the inline defect inspection tools and/or metrology tools may perform standard characterization processes or non-standard (e.g., proprietary) characterization processes.

The characterization measurements may be performed during (e.g., before steps, between steps, and/or after steps of) the fabrication of the one or more semiconductor devices (e.g., the wafers 104) in the lot via a plurality of semiconductor fabrication processes performed by a plurality of semiconductor fabrication tools. For example, the one or more Semiconductor Fab Characterization subsystems 102 may include, but are not limited to, one or more process tools configured to manufacture semiconductor devices including 1, 2, . . . N number of layers fabricated following a number (e.g., tens, hundreds, thousands) of steps performed by a number of semiconductor fabrication processes.

In some embodiments, the system 100 includes an Electrical Test subsystem 106. The Semiconductor Fab Characterization subsystem 102 provides the wafers 104 and/or die material to the Electrical Test subsystem 106. The Electrical Test subsystem 106 may be configured to output test data 108 including data after probing the lot of wafers 104, the probed wafers being represented as a lot of wafers 108. For example, the Electrical Test subsystem 106 may include, but are not limited to, one or more electrical test tools, one or more stress test tools, or the like. The Electrical Test subsystem 106 may be configured to test semiconductor devices fabricated by one or more semiconductor fabrication processes performed via the Semiconductor Fab Characterization subsystem 102. For purposes of the present disclosure, "test" may be understood as referring to the process of electrically evaluating the device functionality at the conclusion of a fabrication manufacturing process (e.g., electrical wafer sort (EWS) processes, or the like), the conclusion of packaging, and/or at the conclusion of final tests (e.g., after burn-in processes and other quality check processes). It is noted herein non-passing semiconductor dies or wafers may be isolated from passing semiconductor dies or wafers, and/or flagged for further testing. Data representing the probed lot of wafers 108 may be in the form of a probe map, or may be used to generate a probe map.

In some embodiments, the system 100 includes a Statistical Outlier Detection subsystem 110. The Electrical Test subsystem 106 may output the test data 108 to the Statistical Outlier Detection subsystem 110. The Statistical Outlier Detection subsystem 110 may output outlier data or electrical test bin data 112, where the electrical test bin data 112 includes semiconductor die data for the wafers 104 in the lot. For example, the Statistical Outlier Detection subsystem 110 may include and/or be configured to perform Z-PAT methodologies. By way of another example, the Statistical Outlier Detection subsystem 110 may include and/or be configured to perform other PAT methodologies or other known statistical outlier determination techniques.

Figure 2:
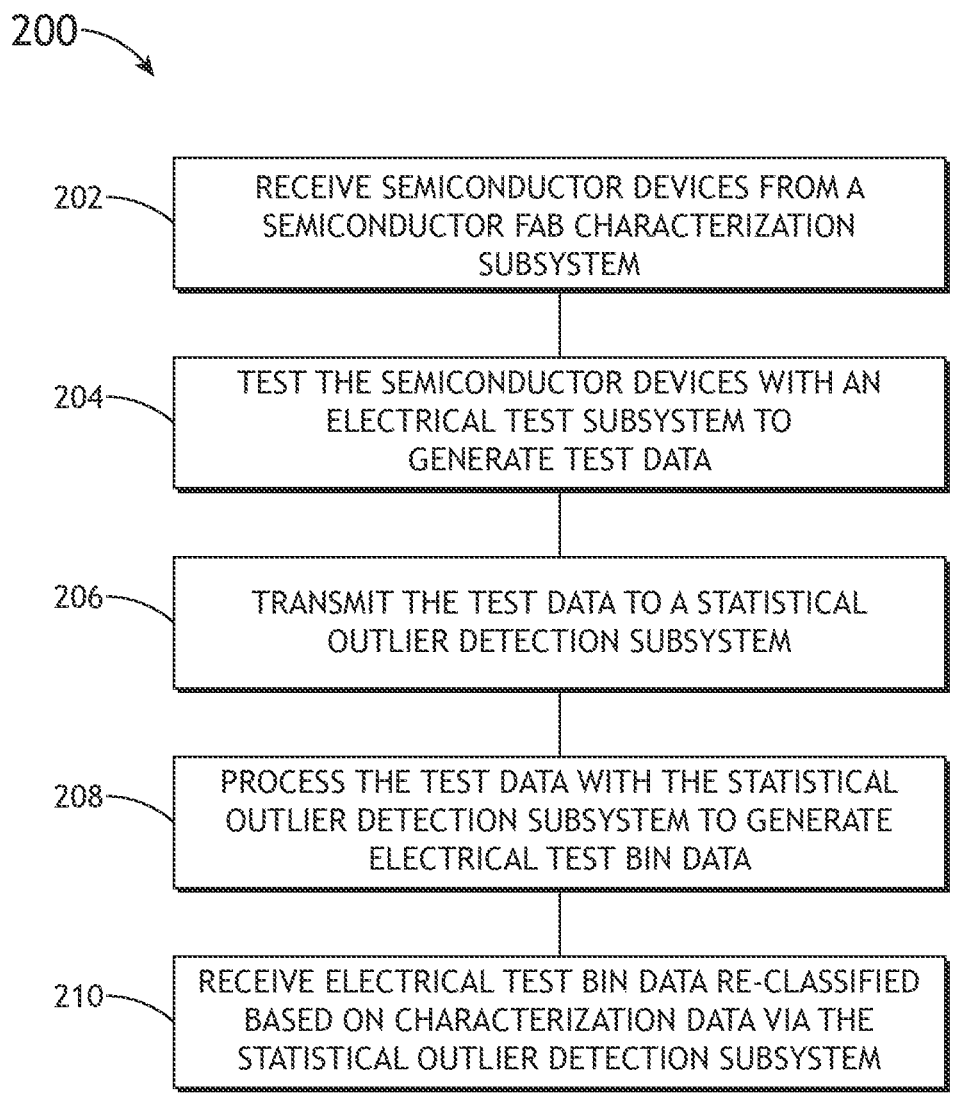
FIG. 2 is a flow diagram illustrating steps performed in a method or process for detection of semiconductor reliability failures, in accordance with one or more embodiments of the present disclosure.

FIG. 2 illustrates a method or process 200 for detection of semiconductor reliability failures, in accordance with one or more embodiments of the present disclosure. It is noted herein that the steps of method or process 200 may be implemented all or in part by the system 100 illustrated in FIG. 1. It is further recognized, however, that the method or process 200 is not limited to the system 100 illustrated in FIG. 1 in that additional or alternative system-level embodiments may carry out all or part of the steps of method or process 200.

In a step 202, semiconductor devices are received from a Semiconductor Fab Characterization subsystem. In some embodiments, the Semiconductor Fab Characterization subsystem 102 is configured to fabricate a lot of wafers 104. For example, the Semiconductor Fab Characterization subsystem 102 may include, but is not limited to, one or more process tools configured to manufacture semiconductor devices including 1, 2, . . . N number of layers fabricated following a number (e.g., tens, hundreds, thousands) of steps performed by a number of semiconductor fabrication processes.

In a step 204, the semiconductor devices are tested with an Electrical Test subsystem to generate test data. In some embodiments, the Electrical Test subsystem 106 receives the lot of wafers 104. For example, the Electrical Test subsystem 106 may perform electrical tests and/or stress tests to the generate test data 108.

In a step 206, the test data is transmitted to a Statistical Outlier Detection subsystem. In some embodiments, the Electrical Test subsystem 106 transmits the test data 108 to the Statistical Outlier Detection subsystem 110.

In a step 208, the test data is processed with the Statistical Outlier Detection subsystem to generate electrical test bin data. In some embodiments, the Statistical Outlier Detection subsystem 110 may determine the location and/or systematic spreading of presumed electrically-failing die on select wafers 104 of the lot based on known electrically-failing die on other wafers 104 of the lot in the test data 108 received from the Electrical Test subsystem 106.

In a step 210, electrical test bin data re-classified based on characterization data is received via the Statistical Outlier Detection subsystem. In some embodiments, at least some of the semiconductor die data in the electrical test bin data 112 is re-classified using one or more steps of methods or processes 500 or 800, described in detail further herein. It is noted herein one or more adjustments may be determined for at least one of the fabricating, characterizing, and/or testing of the semiconductor devices based on the re-classification of the electrical test bin data 112 and/or defects newly-found during the performing of the methods or processes 500 or 800. For example, the one or more adjustments may modify fabrication processes or methods, characterization processes or methods, test processes or methods, or the like provided in a feedback loop to components within the Semiconductor Fab Characterization subsystem 102. For instance, the fabrication processes or methods, characterization processes or methods, test processes or methods, or the like may be adjusted (e.g., via one or more control signals) based on the re-classification of the electrical test bin data 112 and/or defects newly-found during the performing of the methods or processes 500 or 800.

Figure 3A:
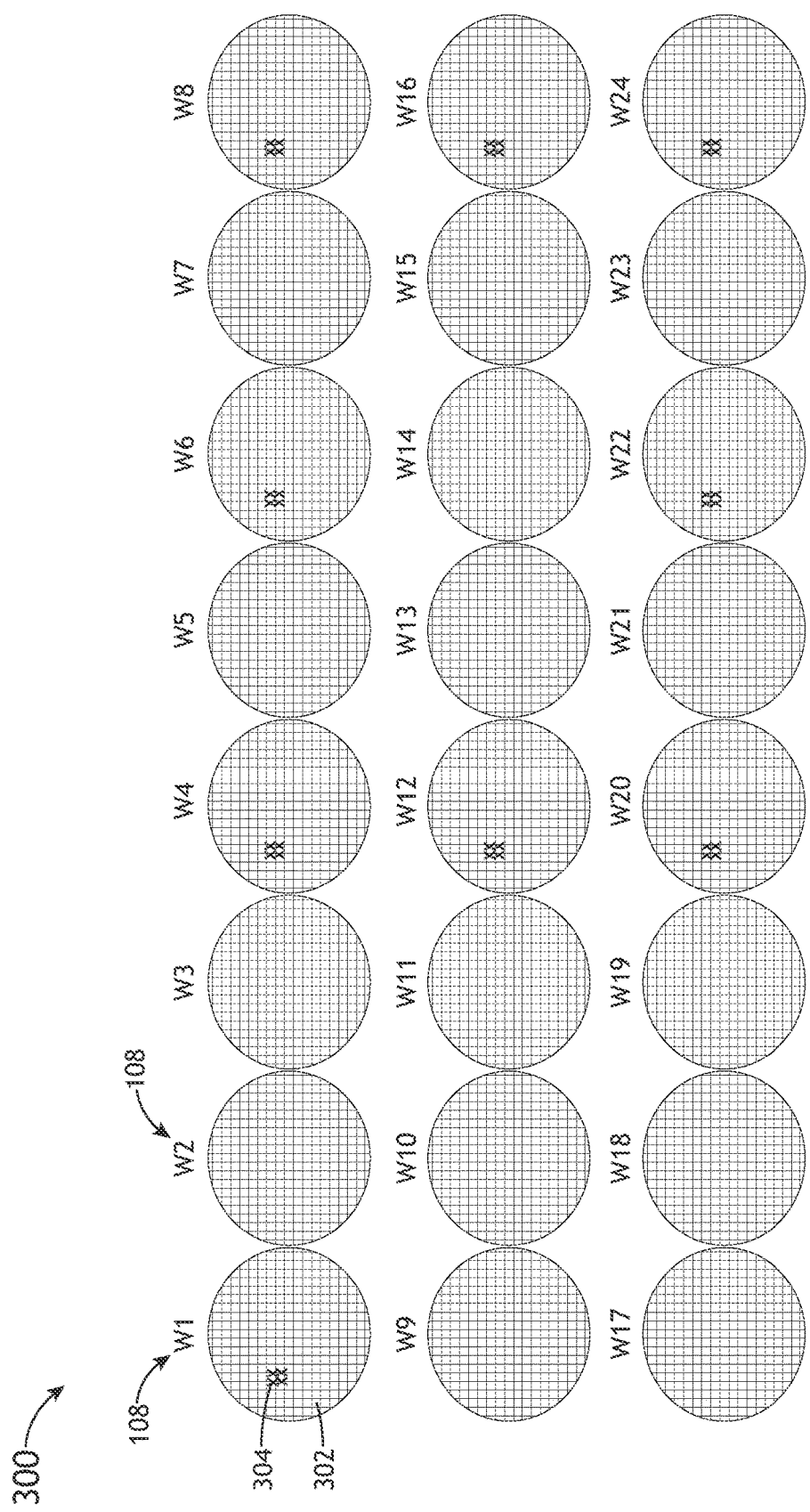
FIG. 3A is a probe map illustrating detected semiconductor reliability failures, in accordance with one or more embodiments of the present disclosure.
Figure 3B:
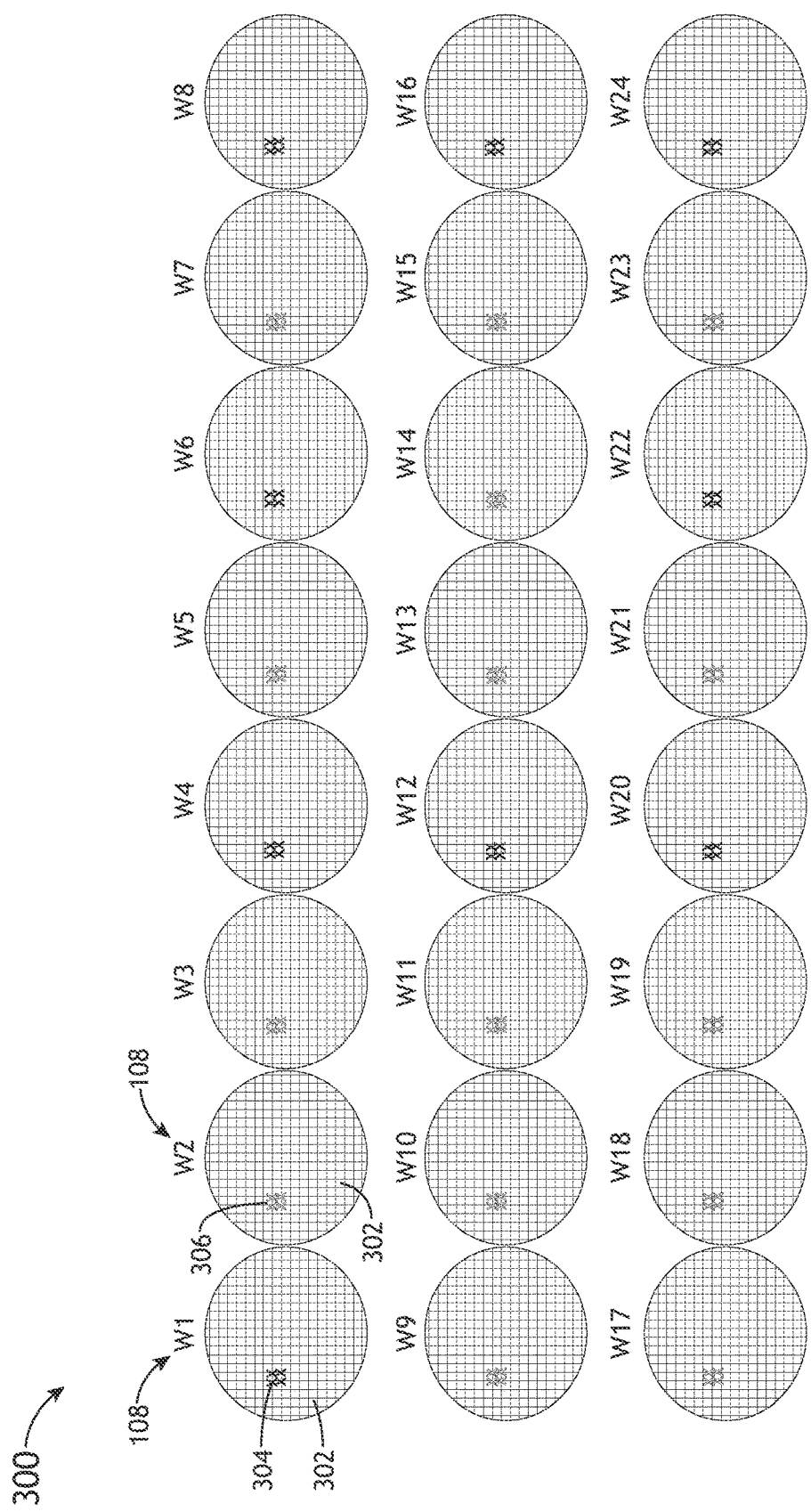
FIG. 3B is a probe map illustrating detected and presumed semiconductor reliability failures, in accordance with one or more embodiments of the present disclosure.

FIGS. 3A and 3B in general illustrate a probe map 300 of a lot of wafers 108, in accordance with one or more embodiments of the present disclosure.

Referring now to FIG. 3A, select wafers 108 in the lot include good die 302 and electrically-failing die 304, where the electrically-failing die 304 include indicators of probed issues in the electrical test bin data 112. In the non-limiting example illustrated in FIG. 3A, 9 of 24 wafers 108 (e.g., W1, W4, W6, W8, W12, W16, W20, W22, W24) in the probe map 300 exhibit clustered electrically-failing die 304 in the same x, y position on the respective wafers.

Referring now to FIG. 3B, Z-PAT is performed on the lot of wafers 108 by the Statistical Outlier Detection subsystem 110. During Z-PAT, die 306 may be inked out as being potentially electrically-failing due to their similarity in x, y position to the known electrically-failing die 304 based on a rule set including a threshold for complete ink-out (e.g., which may be defined on a per-fab basis, or may be determined for multiple fabs). For example, the threshold may represent an overkill limit which is dependent on the number of electrically-failing die 304 observed by the Electrical Test subsystem 106. Where the threshold is exceeded, the Statistical Outlier Detection subsystem 110 may ink out the potentially electrically-failing die 306 in the same x, y position on wafers 108 as the known electrically-failing die 304 on other wafers 108, due to the potentially electrically-failing die 306 being believed to include defects due to an associated positioning with known electrically-failing die 304. For example, the remaining 15 of 24 wafers 108 (e.g., W2, W3, W5, W7, W9, W10, W11, W13, W14, W15, W17, W18, W19, W21, W23) may include potentially electrically-failing die 306 in the same x, y position, which may be inked out. For instance, the Electrical Test subsystem 106 may not have sufficiently captured the escapes due to them being latent reliability defects (LRD) and/or due to a gap in test coverage.

The Z-PAT methodologies listed above have a number of shortcomings. For example, the Z-PAT methodologies listed above may result in excessive yield loss, or overkill, which results from it being relatively uncommon that presumed fails will actually manifest as reliability fails or customer returns, although risk-averse semiconductor suppliers to the automotive segment will usually make this sacrifice. By way of another example, the Z-PAT methodologies listed above do not generally provide sufficient information about the underlying cause of the failure to allow the semiconductor manufacturing engineers to prevent it from happening in the future (or at least create a baseline to monitor the frequency of occurrence), resulting in adjustments to the system 100 and/or the method or process 200 being reactive and not proactive. As such, any methodology which may provide insight into the causal failure mechanism and/or propagation of this failure mechanism to other wafers would enable better decision-making, thus reducing overkill.

Embodiments of the present disclosure are directed to a system and method for Z-PAT defect-guided statistical outlier detection of semiconductor reliability failures. Embodiments of the present disclosure are also directed to identification of Z-PAT defect signatures representing potential reliability and/or test gap defects at the same x, y position on multiple wafers within a lot using characterization data (e.g., inline defect inspection data and/or metrology data. Embodiments of the present disclosure are also directed to identification of Z-PAT defect signatures using statistical outlier algorithms. Embodiments of the present disclosure are also directed to automatic notification to fab engineers of the presence of Z-PAT defect signatures. Embodiments of the present disclosure are also directed to characterization of Z-PAT defect signatures using spatial signature analysis methods. Embodiments of the present disclosure are also directed to characterization of Z-PAT defect signatures using machine learning methods.

Embodiments of the present disclosure are also directed to identification of the presence or non-presence of Z-PAT defect signatures within a given lot. Embodiments of the present disclosure are also directed to identification of Z-PAT defect signatures on adjacent lots. Embodiments of the present disclosure are also directed to identification of Z-PAT defect signatures which are undetected by electrical test-based Z-PAT. Embodiments of the present disclosure are also directed to reduction in overkill by using Z-PAT defect signatures to more precisely bound the extent of the impacted die/wafers. Embodiments of the present disclosure are also directed to rapid identification of underlying root cause based on learning from previously characterized Z-PAT defect signatures. Embodiments of the present disclosure are also directed to retroactive identification of Z-PAT defect signatures to direct warranty and/or recall efforts using stored inline defect data.

Figure 4:
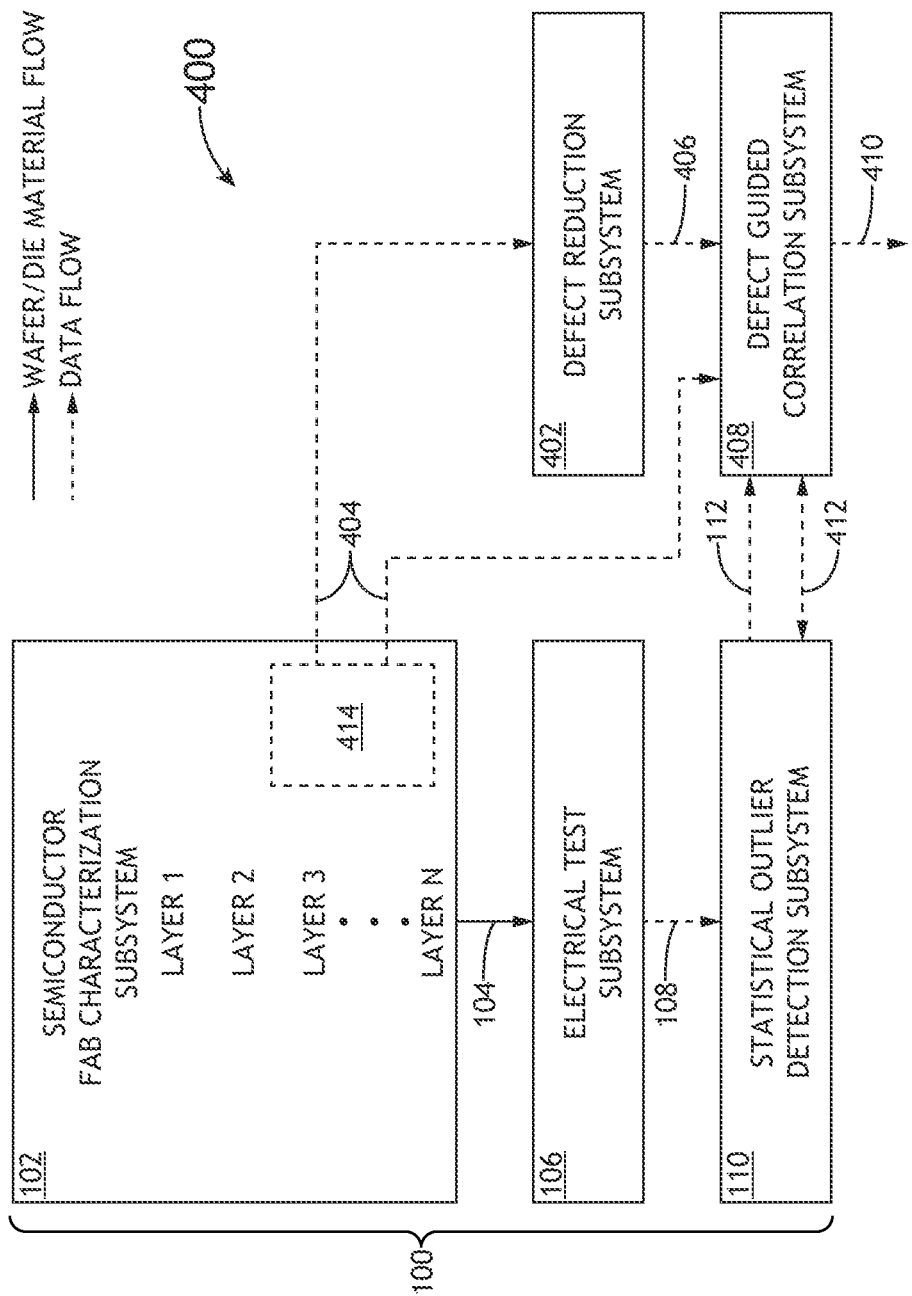
FIG. 4 is a block diagram view of a system for Z-direction Part Average Testing (Z-PAT) defect-guided statistical outlier detection of semiconductor reliability failures, in accordance with one or more embodiments of the present disclosure.

FIG. 4 illustrates a system 400 for Z-PAT defect-guided statistical outlier detection of semiconductor reliability failures, in accordance with one or more embodiments of the present disclosure. It is noted herein the system 400 may allow semiconductor manufacturers to more precisely identify die with an elevated risk of early life reliability failures or test coverage gaps, and/or allow the supplier to better disposition die from wafers containing systematic defectivity that occurs at a same x, y location on multiple wafers in a given lot through Z-PAT methodologies.

In some embodiments, the system 400 includes one or more components of the system 100. The system 400 may include the Semiconductor Fab Characterization subsystem 102 configured to fabricate and characterize semiconductor wafers 104. The system 400 may include the Electrical Test subsystem 106 configured to receive the wafer 104 and perform electrical testing to generate test data 108. The system 400 may include the Statistical Outlier Detection subsystem 110 configured to receive the test data 108 and output outlier data 112 following the application of Z-PAT methodologies.

In some embodiments, the system 400 includes a Defect Reduction subsystem 402. The Defect Reduction subsystem 402 may be configured to receive characterization data 404 (e.g., characterization measurements including, but not limited to, inline defect inspection measurements and/or metrology measurements) extracted during (e.g., before steps, between steps, and/or after steps of) the fabrication of the one or more semiconductor devices (e.g., the wafers 104) via the plurality of semiconductor fabrication processes performed by the plurality of semiconductor fabrication tools, where the characterization data 404 includes semiconductor die data for the wafers 104 in the lot.

The Defect Reduction subsystem 402 may be configured to generate filtered characterization data 406 (or filtered data 406, for purposes of the present disclosure), which is a subset of characterization data 404. The filtered characterization data 406 may be generated via one or more I-PAT methods or processes. It is noted herein systems and methods for I-PAT are described in United States Patent Publication No. US 2018/0328868 A1, published Nov. 15, 2018. In addition, it is noted herein systems and methods for I-PAT are described in U.S. Pat. No. 10,761,128, issued Sep. 1, 2020, as well as U.S. application Ser. No. 17/101,856, filed Nov. 23, 2020, both of which are previously incorporated herein in the entirety. In this regard, the Defect Reduction subsystem 402 may be considered an I-PAT Analyzer, for purposes of the present disclosure.

In some embodiments, the system 400 includes a Defect-Guided Correlation subsystem 408. The Defect Reduction subsystem 402 may be configured to output the filtered characterization data 406 to the Defect-Guided Correlation subsystem 408. The Defect-Guided Correlation subsystem 408 may be configured to output improved electrical die bin data 410 (e.g., with improved semiconductor die data) to interested parties (e.g., fab engineers), and/or may be configured to output re-classified electrical die bin data 412 (e.g., with re-classified semiconductor die data) to the Statistical Outlier Detection subsystem 110. For example, the improved electrical die bin data 410 and/or the re-classified electrical die bin data 412 may be determined through deterministic and/or statistical thresholding methods or processes, spatial signature analysis methods or processes, advanced deep learning or machine learning methods or processes, or the like. In general, the machine learning techniques may be any technique known in the art including, but not limited to, supervised learning, unsupervised learning, or other learning-based processes such as, but not limited to, linear regression, neural networks or deep neural networks, heuristic-based model, or the like. The outputting of the improved electrical die bin data 410 and/or the re-classified electrical die bin data 412 including Z-PAT defect signatures may be automatically performed to interested parties (e.g., fab engineers) and/or to the Statistical Outlier Detection subsystem 110 following the determination of the improved electrical die bin data 410 and/or the re-classified electrical die bin data 412.

It is noted herein the improved electrical die bin data 410 and/or the re-classified electrical die bin data 412 may result in a reduction of overkill by using Z-PAT defect signatures to more precisely bound the extent of the impacted die/wafers. In addition, is it noted herein the improved electrical die bin data 410 and/or the re-classified electrical die bin data 412 may be in response to the identification of the presence or non-presence of Z-PAT defect signatures within a given lot. Further, it is noted herein the improved electrical die bin data 410 and/or the re-classified electrical die bin data 412 may be in response to the identification of Z-PAT defect signatures on adjacent lots. Further, it is noted herein the improved electrical die bin data 410 and/or the re-classified electrical die bin data 412 may be in response to the identification of Z-PAT defect signatures which are undetected by electrical test based Z-PAT. Further, it is noted herein the improved electrical die bin data 410 and/or the re-classified electrical die bin data 412 may be for rapid identification of underlying root cause based on learning from previously characterized Z-PAT defect signatures. Further, it is noted herein the improved electrical die bin data 410 and/or the re-classified electrical die bin data 412 may be for retroactive identification of Z-PAT defect signatures to direct warranty and/or recall efforts using stored inline defect data.

It is noted herein the characterization data 404 may be run through recipes of fab-wide Defect Management subsystem 414 (e.g., fab yield management subsystem) to filter the characterization data 404, such that the Defect-Guided Correlation subsystem 408 may process partially-analyzed characterization data 404 and/or filtered data 406 (e.g., when the characterization data 404 is first passed through the Defect Reduction subsystem 402).

Although embodiments of the present disclosure illustrate extracting the characterization data 404 from the Semiconductor Fab Characterization subsystem 102 and processing it with the Defect Reduction subsystem 402 prior to generating and providing the filtered characterization data 406 to the Defect-Guided Correlation subsystem 408, it is noted herein the characterization data 404 may be provided as raw data directly to the Defect-Guided Correlation subsystem 408 from the Semiconductor Fab Characterization subsystem 102. In this regard, the Defect Reduction subsystem 402 may not be considered a required component of the system 400, for purposes of the present disclosure. Therefore, the above description should not be interpreted as a limitation on the scope of the present disclosure but merely an illustration.

Although embodiments of the present disclosure illustrate the Defect-Guided Correlation subsystem 408 as being separate from the Defect Reduction subsystem 402, it is noted herein the Defect-Guided Correlation subsystem 408 may be integrated into the Defect Reduction subsystem 402, and vice versa. More generally, although embodiments of the present disclosure illustrate the subsystems 102, 106, 110, 402, 408 being separate or standalone subsystems within the system 400, it is noted herein one or more of the subsystems 102, 106, 110, 402, 408 may be combined or integrated subsystems. Therefore, the above description should not be interpreted as a limitation on the scope of the present disclosure but merely an illustration.

Figure 5:
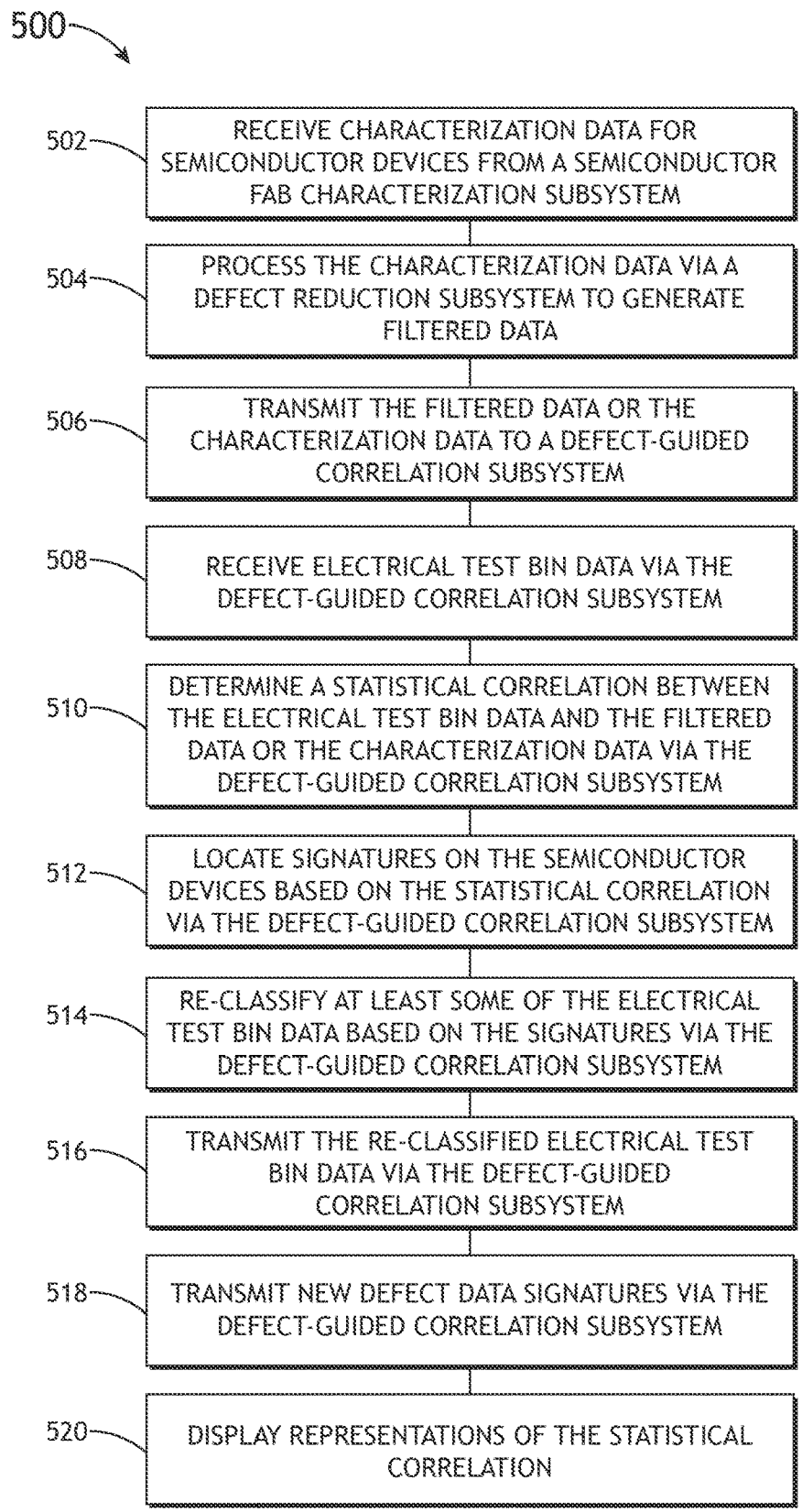
FIG. 5 is a flow diagram illustrating steps performed in a method or process for Z-PAT defect-guided statistical outlier detection of semiconductor reliability failures, in accordance with one or more embodiments of the present disclosure.

FIG. 5 illustrates a method or process 500 for Z-PAT defect-guided statistical outlier detection of semiconductor reliability failures, in accordance with one or more embodiments of the present disclosure. It is noted herein that the steps of method or process 500 may be implemented all or in part by the system 400 illustrated in FIG. 4. It is further recognized, however, that the method or process 500 is not limited to the system 400 illustrated in FIG. 4 in that additional or alternative system-level embodiments may carry out all or part of the steps of method or process 500.

In a step 502, characterization data is received for semiconductor devices from a Semiconductor Fab Characterization subsystem. In some embodiments, the Semiconductor Fab Characterization subsystem 102 is configured to perform characterization measurements during the fabrication of the one or more wafers 104. For example, the Semiconductor Fab Characterization subsystem 102 may include, but is not limited to, one or more inline defect inspection and/or metrology tools configured to characterize the semiconductor devices. For instance, the one or more outputs may include, but are not limited to, baseline inspections (e.g., sampling-based inspections), screening inspections at key semiconductor device layers, or the like. For purposes of the present disclosure, "characterization" may refer to either inline defect inspection or inline metrology measurements.

In a step 504, the characterization data is processed via a Defect Reduction subsystem to generate filtered data. In some embodiments, the Defect Reduction subsystem 402 may receive the characterization data 404 and generate filtered characterization data 406. The Defect Reduction subsystem 402 may include or be configured to perform I-PAT methodologies. In this regard, the Defect Reduction subsystem 402 may be considered an I-PAT Analyzer, for purposes of the present disclosure.

In a step 506, the filtered data and/or the characterization data is transmitted to a Defect-Guided Correlation subsystem. In some embodiments, the filtered characterization data 406 is transmitted to the Defect-Guided Correlation subsystem 408 from the Defect Reduction subsystem 402, and/or the characterization data 404 is transmitted to the Defect-Guided correlation subsystem 408 from the Semiconductor Fab Characterization subsystem 102. It is noted herein that step 504 may be optional where the characterization data 404 is directly transferred to the Defect-Guided Correlation subsystem 408, such that the filtered characterization data 406 is not used by the Defect-Guided Correlation subsystem 408.

In a step 508, electrical test bin data is received by the Defect-Guided Correlation subsystem. In some embodiments, the electrical test bin data 112 is generated via one or more steps of the method or process 200 by one or more components of the system 100.

In a step 510, a statistical correlation is determined between the electrical test bin data and the filtered data or the characterization data via the Defect-Guided Correlation subsystem. In some embodiments, the filtered characterization data 406 and/or the characterization data 404 is overlaid on the electrical test bin data 112 by the Defect-Guided Correlation subsystem 408. For example, the filtered characterization data 406 may be determined by the Defect Reduction subsystem 402 based on its association with the particular Z-PAT systematic failure mechanism under study (e.g., in the electrical test bin data 112). By way of another example, all characterization data 404 may be overlaid on the electrical test bin data 112.

In a step 512, defect data signatures are located on the semiconductor devices based on the statistical correlation via the Defect-Guided Correlation subsystem. In some embodiments, if a statistical correlation is found following the overlay of the filtered characterization data 406 and/or the characterization data 404 on the electrical test bin data 112, the system 400 (e.g., the Defect-Guided Correlation subsystem 408, or other component of the system 400) looks for similar defect/metrology signatures on lots of wafers 104 processed before and after the lot of wafers 104 undergo study.

In a step 514, at least some semiconductor die data in the electrical test bin data is re-classified based on the defect data signatures via the Defect-Guided Correlation subsystem. In some embodiments, depending on the results and applied disposition logic, the system 400 (e.g., the Defect-Guided Correlation subsystem 408, or other component of the system 400) reclassifies the bin associated with the dies 302/304/306 under consideration. For example, the bin may be confirmed as including the failure found in the electrically-failing die 304 by the Statistical Outlier Detection subsystem 110. By way of another example, a bin may be changed to indicate the failure found in the known electrically-failing die 304 or potentially electrically-failing die 306 by the Statistical Outlier Detection subsystem 110 is a good die 302. By way of another example, a bin may be changed to indicate a good die 302 may or does include a failure and so should be considered a potentially electrically-failing die 306 or known electrically-failing die 304.

In a step 516, the re-classified electrical test bin data is transmitted via the Defect-Guided Correlation subsystem. In some embodiments, improved electrical test bin data 410 is transmitted or otherwise provided to parties (e.g., fab engineers) by the Defect-Guided Correlation subsystem 408. For example, the improved electrical test bin data 410 may include recommendations about whether to ink out die (e.g., believed good die 302 and/or potentially electrical-failing die 306) with the same x, y position as known electrically-failing die 304. For instance, the recommendations may be made based on a rule set including a threshold for complete ink-out (e.g., which may be defined on a per-fab basis, or may be determined for multiple fabs).

In a step 518, new defect data signatures are transmitted via the Defect-Guided Correlation subsystem. In some embodiments, new defect data signatures may be transmitted or otherwise provided to the Statistical Outlier Detection subsystem 110 by the Defect-Guided Correlation subsystem 408 as part of the re-classified electrical die bin data 412. For example, the Statistical Outlier Detection subsystem 110 may use the new defect data signatures when processing subsequent lots of wafers 104 to adjust the resultant electrical test bin data 112. By way of another example, the Statistical Outlier Detection subsystem 110 may output the new defect data signatures to the Semiconductor Fab Characterization subsystem 102 for adjustment of components or methods or processes of the Semiconductor Fab Characterization subsystem 102. It is noted herein the Semiconductor Fab Characterization subsystem 102 may receive the new defect data signatures directly instead of or in addition to the Statistical Outlier Detection subsystem 110.

In a step 520, representations of the statistical correlation are displayed. In some embodiments, overlay of the filtered characterization data 406 and/or the characterization data 404 on the electrical test bin data 112 are presented on a graphical user interface. For example, the representations may be quantitative representations (e.g., data lists, tables, or the like) or qualitative representations (e.g., graphs, charts, images, videos, or the like) of the data overlay and corresponding metrics. The representations may be accompanied by recommendations for improvement to the various steps performed by the methods or processes 200 and/or 500.

Figure 6A:
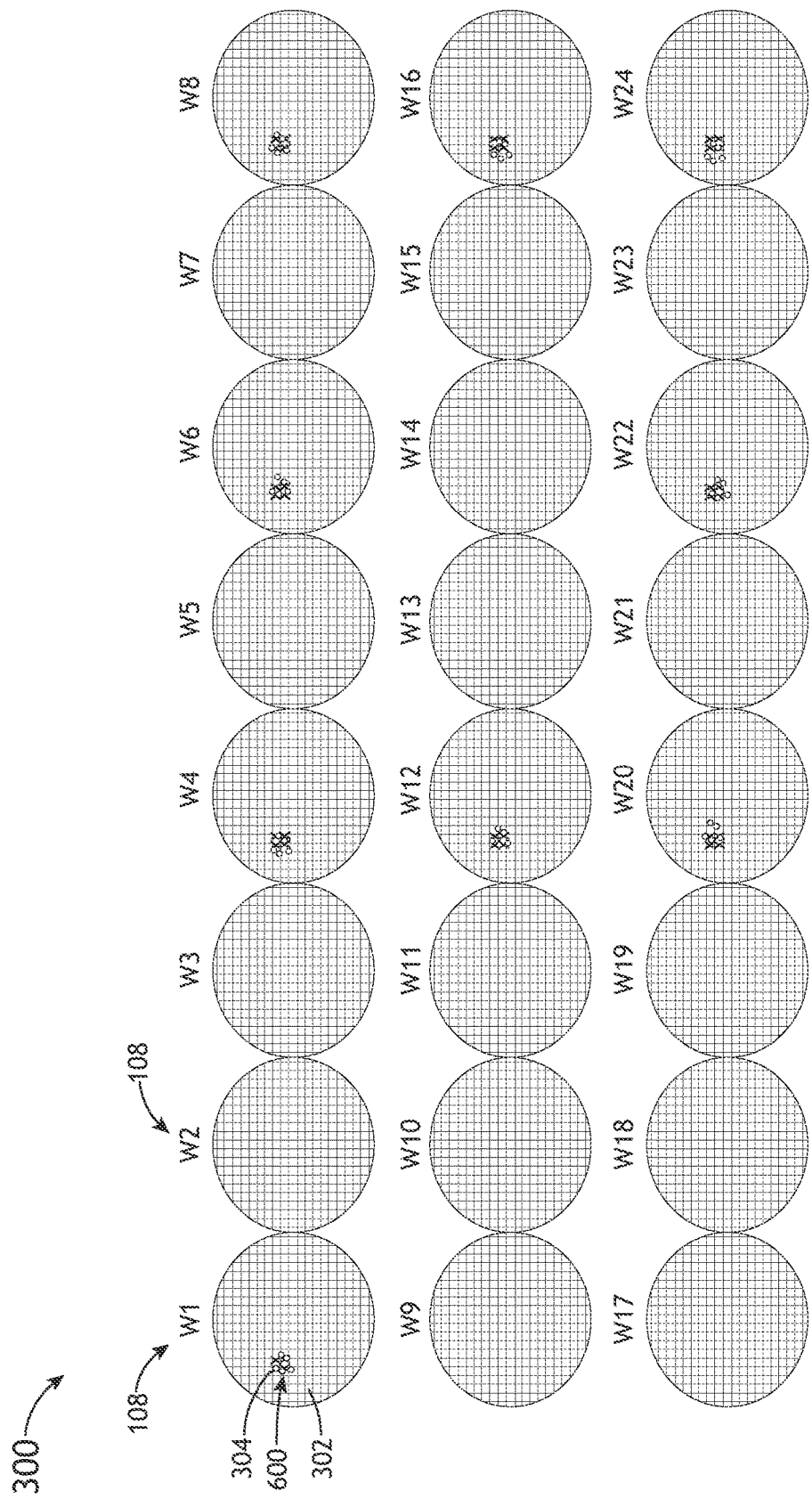
FIG. 6A is a probe map illustrating detected semiconductor reliability failures overlaid with characterization data, in accordance with one or more embodiments of the present disclosure.
Figure 6B:
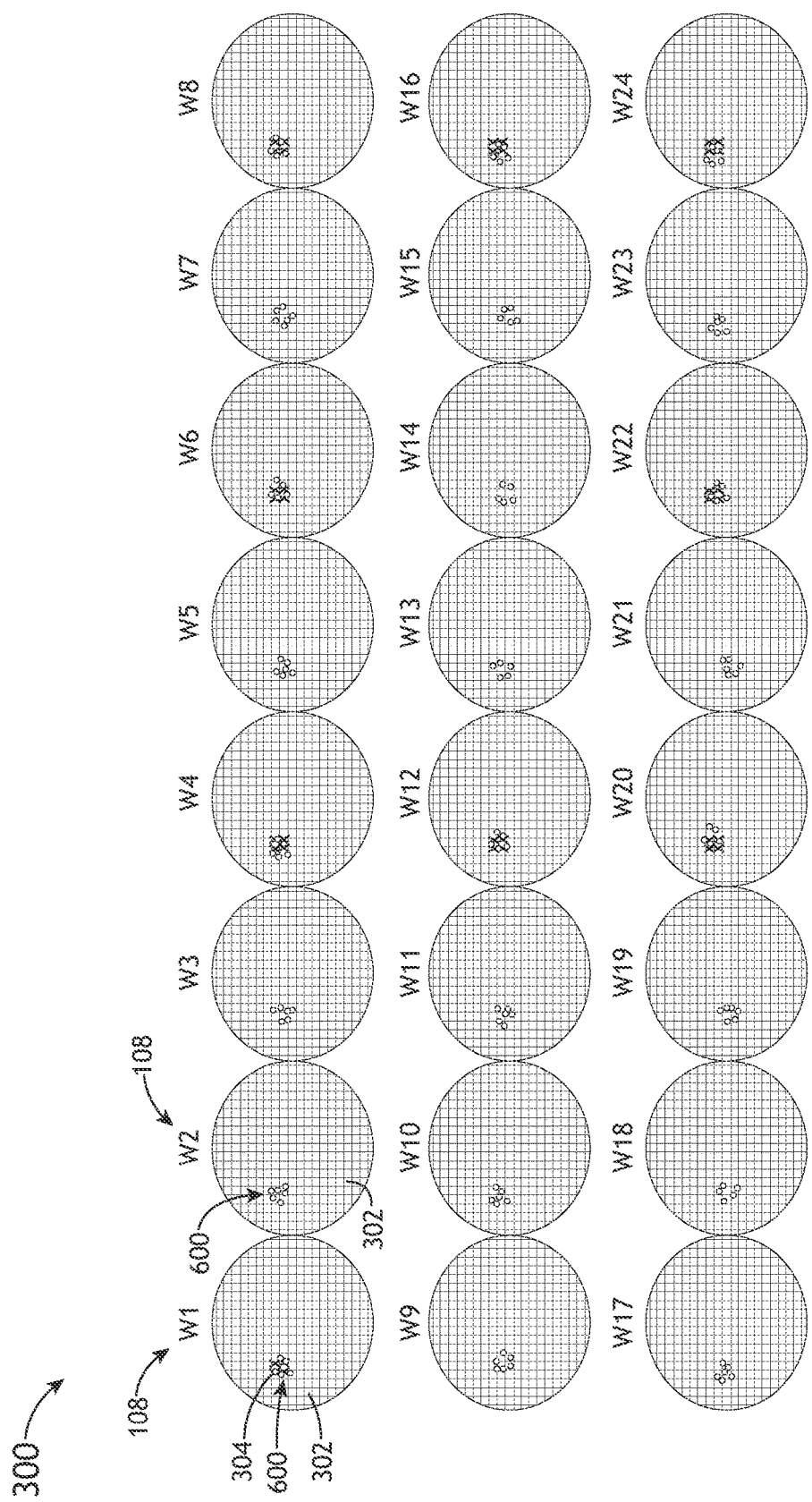
FIG. 6B is a probe map illustrating detected semiconductor reliability failures overlaid with characterization data, in accordance with one or more embodiments of the present disclosure.

FIGS. 6A and 6B in general illustrate the probe map 300 of the lot of wafers 108, in accordance with one or more embodiments of the present disclosure. In FIGS. 6A and 6B, the filtered characterization data 406 and/or the characterization data 404 is overlaid on the probe map 300 as defect data 600 for a particular failure mechanism. The statistical correlation is performed between the characterization data 404 and the electrical test bin data 112 for both the wafers 108 with the electrical test failing die 304 (e.g., W1, W4, W6, W8, W12, W16, W20, W22, W24) and the remaining wafers 108 in the lot.

Referring now to FIG. 6A, the Defect-Guided Correlation subsystem 408 determines that one or more defects for the particular failure mechanism are the root cause of the failures on the affected wafers 108 (e.g., W1, W4, W6, W8, W12, W16, W20, W22, W24) based on an overlay of the defect data 600 on the electrical test bin data 112. In this non-limiting example, the Defect-Guided Correlation subsystem 408 determines the Electrical Test subsystem 106 did sufficiently capture the escapes based on the overlay, such that it is not necessary to ink off the die 302 on the other wafers 108.

Referring now to FIG. 6B, the Defect-Guided Correlation subsystem 408 determines that one or more defects for the particular failure mechanism are the root cause of the failures on the affected wafers 108 (e.g., W1, W4, W6, W8, W12, W16, W20, W22, W24) based on an overlay of the defect data 600 on the electrical test bin data 112. In this non-limiting example, the Defect-Guided Correlation subsystem 408 determines the Electrical Test subsystem 106 did not sufficiently capture the escapes based on the overlay, and that it is necessary to ink off the die 302 on the other wafers 108. For instance, the Electrical Test subsystem 106 may not have sufficiently captured the escapes due to them being latent reliability defects (LRD) and/or due to a gap in test coverage.

It is noted herein the above examples are two non-limiting examples representing the boundaries of possible determinations by the Defect-Guided Correlation subsystem 408.

For example, the Defect-Guided Correlation subsystem 408 may determine only a few of the wafers 108 include escapes or defects per the filtered characterization data 406 and/or the characterization data 404, although the wafers 108 did not include the corresponding electrical test bin data 112. However, it is noted herein the system 400 and method or process 500, if conservatively applied, may trend toward inking the entire set of dies 302 with the same x, y position for the particular failure mechanism across the lot of wafers 108 regardless of the number of escapes. Therefore, the above description should not be interpreted as a limitation on the scope of the present disclosure but merely an illustration.

Although embodiments of the present disclosure illustrate the defect data 600 as only including the filtered characterization data 406 and/or the characterization data 404 for a particular failure mechanism overlaid on the probe map 300, it is noted herein the overlay is not limited to the particular failure mechanism and that any additional (or all additional) filtered characterization data 406 and/or characterization data 404 may be overlaid on the probe map 300. Therefore, the above description should not be interpreted as a limitation on the scope of the present disclosure but merely an illustration.

Although embodiments of the present disclosure illustrate the overlay of the defect data 600 on the electrical test bin data 112, it is noted herein the system 400 may be configured to proactively seek to identify undetected repeating spatial signatures in defectivity across wafers 104 independently of the presence of electrical test bin data 112. For example, this may be performed by or within the Defect-Guided Correlation subsystem 408, the Defect Reduction subsystem 402, or yield management systems included in or associated with the system 400. Therefore, the above description should not be interpreted as a limitation on the scope of the present disclosure but merely an illustration.

In this regard, the system 400 and method or process 500 may be configured to reduce potential yield loss, or overkill, as fewer good die 302 are inked off that are not part of the presumed underlying reliability problem, which potentially results in additional revenue for the semiconductor supplier.

In addition, the system 400 and method or process 500 may be configured to provide information about the underlying root cause of the failure mechanism (failures in the same location on multiple wafers), providing valuable feedback to a quality engineer and/or semiconductor manufacturing facility to drive elimination of the root cause in future wafers being processed.

Further, the system 400 and method or process 500 may be configured for identification of Z-PAT signatures on adjacent lots, including identifying other wafers potentially impacted by the same root cause (e.g., other wafers outside of the lot under consideration), which may result in quality improvements by reducing escapes on lots not identified by traditional Z-PAT ink-off. For example, identifying Z-PAT signatures on adjacent lots may catch an issue at an earlier stage in its gradual growth/propagation, by providing granularity via defect data that may not be available through electrical test bin data 112.

Further, the system 400 and method or process 500 may be configured for proactive identification of other Z-PAT signatures that are completely undetected by wafer probe and/or final test.

Figure 7A:
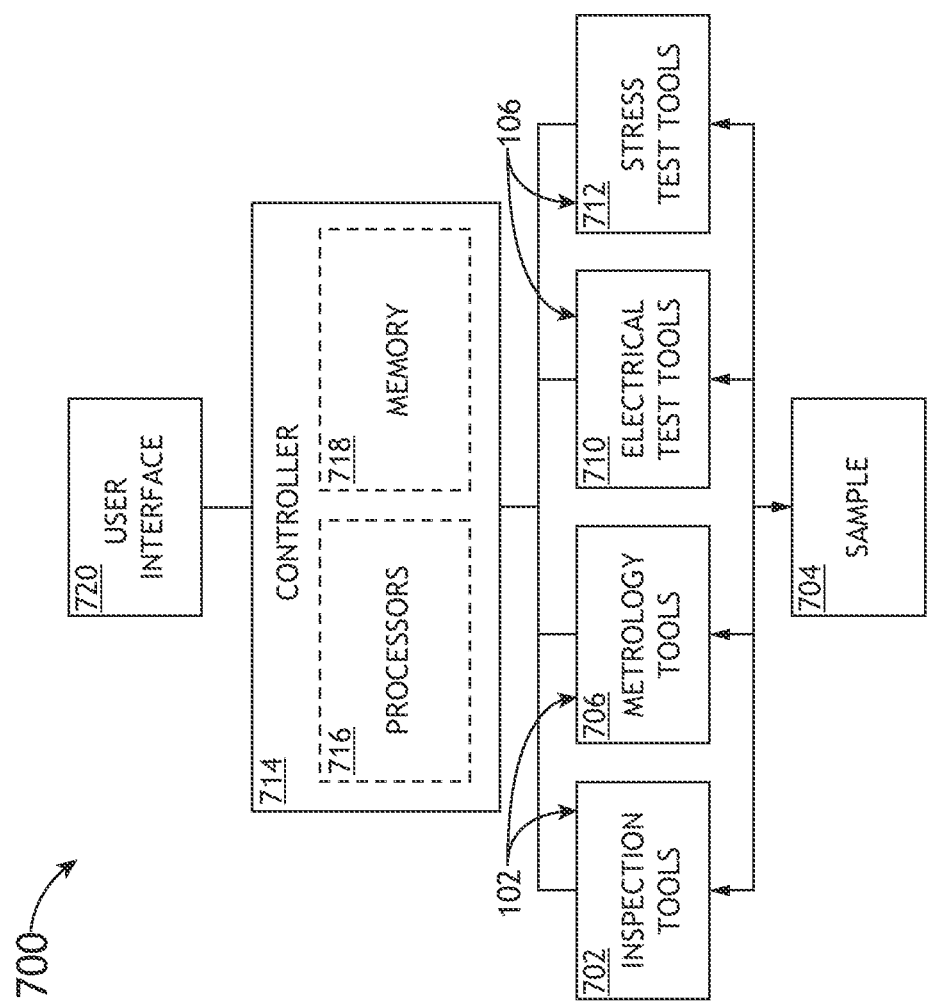
FIG. 7A is a block diagram view of a system for fabricating, characterizing, and/or testing of semiconductor devices, in accordance with one or more embodiments of the present disclosure.
Figure 7B:
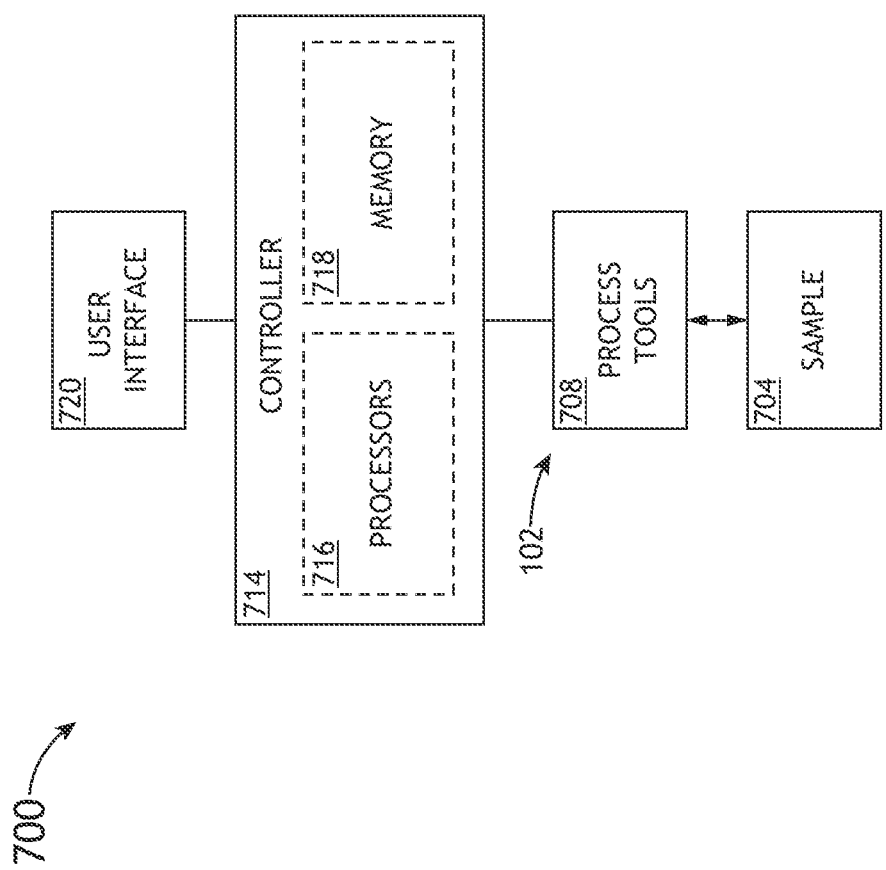
FIG. 7B is a block diagram view of a system for fabricating, characterizing, and/or testing of semiconductor devices, in accordance with one or more embodiments of the present disclosure.

FIGS. 7A and 7B illustrate block diagrams of a system 700, in accordance with one or more embodiments of the present disclosure. It is noted herein the system 700 may be configured to perform processing steps to fabricate and/or analyze semiconductor devices and/or components (e.g., semiconductor dies) on semiconductor devices, as described throughout the present disclosure. In addition, it is noted herein the system 700 may include all of or a part of the system 100 and/or the system 400, as described throughout the present disclosure.

In some embodiments, the system 700 includes the Semiconductor Fab Characterization subsystem 102 and the Electrical Test subsystem 106.

In some embodiments, the Semiconductor Fab Characterization subsystem 102 includes one or more characterization tools configured to output characterization measurements within (or as) characterization data 404. For example, the characterization measurements may include, but are not limited to, baseline inspections (e.g., sampling-based inspections), screening inspections at key semiconductor device layers, or the like. For purposes of the present disclosure, "characterization measurements" may refer to inline defect inspection and/or inline metrology measurements.

In one non-limiting example, the Semiconductor Fab Characterization subsystem 102 may include at least one inspection tool 702 (e.g., an inline sample analysis tool) for detecting defects in one or more layers of a sample 704 (e.g., the wafer 104). The Semiconductor Fab Characterization subsystem 102 may generally include any number or type of inspection tools 702. For example, an inspection tool 702 may include an optical inspection tool configured to detect defects based on interrogation of the sample 704 with light from any source such as, but not limited to, a laser source, a lamp source, an X-ray source, or a broadband plasma source. By way of another example, an inspection tool 702 may include a particle-beam inspection tool configured to detect defects based on interrogation of the sample 704 with one or more particle beams such as, but not limited to, an electron beam, an ion beam, or a neutral particle beam. For instance, the inspection tool 702 may include a transmission electron microscope (TEM) or a scanning electron microscope (SEM). For purposes of the present disclosure, it is noted herein the at least one inspection tool 702 may be a single inspection tool 702 or may represent a group of inspection tools 702.

It is noted herein the sample 704 may be a semiconductor wafer of a plurality of semiconductor wafers, where each semiconductor wafer of the plurality of semiconductor wafers includes a plurality (e.g., 1, 2, . . . N number) of layers fabricated following a number (e.g., tens, hundreds, thousands) of steps performed by a number of semiconductor fabrication processes, where each layer of the plurality of layers includes a plurality of semiconductor dies, where each semiconductor die of the plurality of semiconductor dies includes a plurality of blocks. In addition, it is noted herein the sample 704 may be a semiconductor die package formed from a plurality of semiconductor dies arranged in a 2.5D lateral combination of a bare die on a substrate inside an advanced die package or a 3D die package.

For the purposes of the present disclosure, the term "defect" may refer to a physical defect found by an inline inspection tool, a metrology measurement outlier, or any other physical characteristic of the semiconductor device that is deemed to be an anomaly. A defect may be considered to be any deviation of a fabricated layer or a fabricated pattern in a layer from design characteristics including, but not limited to, physical, mechanical, chemical, or optical properties. In addition, a defect may be considered to be any deviation in alignment or joining of components in a fabricated semiconductor die package. Further, a defect may have any size relative to a semiconductor die or features thereon. In this way, a defect may be smaller than a semiconductor die (e.g., on the scale of one or more patterned features) or may be larger than a semiconductor die (e.g., as part of a wafer-scale scratch or pattern). For example, a defect may include deviation of a thickness or composition of a sample layer before or after patterning. By way of another example, a defect may include a deviation of a size, shape, orientation, or position of a patterned feature. By way of another example, a defect may include imperfections associated with lithography and/or etching steps such as, but not limited to, bridges between adjacent structures (or lack thereof), pits, or holes. By way of another example, a defect may include a damaged portion of a sample 704 such as, but not limited to, a scratch, or a chip. For instance, a severity of the defect (e.g., the length of a scratch, the depth of a pit, measured magnitude or polarity of the defect, or the like) may be of importance and taken into consideration. By way of another example, a defect may include a foreign particle introduced to the sample 704. By way of another example, a defect may be a misaligned and/or mis-joined package component on the sample 704. Accordingly, it is to be understood that examples of defects in the present disclosure are provided solely for illustrative purposes and should not be interpreted as limiting.

In another non-limiting example, the Semiconductor Fab Characterization subsystem 102 may include at least one metrology tool 706 (e.g., an inline sample analysis tool) for measuring one or more properties of the sample 704 or one or more layers thereof. For example, a metrology tool 706 may characterize properties such as, but not limited to, layer thickness, layer composition, critical dimension (CD), overlay, or lithographic processing parameters (e.g., intensity or dose of illumination during a lithographic step). In this regard, a metrology tool 706 may provide information about the fabrication of the sample 704, one or more layers of the sample 704, or one or more semiconductor dies of the sample 704 that may be relevant to the probability of manufacturing defects that may lead to reliability issues for the resulting fabricated devices. For purposes of the present disclosure, it is noted herein the at least one metrology tool 706 may be a single metrology tool 706 or may represent a group of metrology tools 706.

In some embodiments, the Semiconductor Fab Characterization subsystem 102 includes at least one semiconductor manufacturing tool or process tool 708. It is noted herein the sample 704 may be moved between the one or more inspection tools 702, the one or more metrology tools 706, and the one or more process tools 708 during fabrication of the sample 704. For example, the process tool 708 may include any tool known in the art including, but not limited to, an etcher, scanner, stepper, cleaner, or the like. For instance, a fabrication process may include fabricating multiple dies distributed across the surface of a sample (e.g., a semiconductor wafer, or the like), where each die includes multiple patterned layers of material forming a device component. Each patterned layer may be formed by the process tool 708 via a series of steps including material deposition, lithography, etching to generate a pattern of interest, and/or one or more exposure steps (e.g., performed by a scanner, a stepper, or the like). By way of another example, the process tool 708 may include any tool known in the art configured to package and/or combine semiconductor dies into a 2.5D and/or 3D semiconductor die package. For instance, a fabrication process may include, but is not limited to, aligning semiconductor dies and/or electrical components on the semiconductor dies. In addition, a fabrication process may include, but is not limited to, joining the semiconductor dies and/or the electrical components on the semiconductor dies via hybrid bonding (e.g., die-to-die, die-to-wafer, wafer-to-wafer, or the like) solder, an adhesive, fasteners, or the like. For purposes of the present disclosure, it is noted herein the at least one process tool 708 may be a single process tool 708 or may represent a group of process tools 708. It is noted herein the terms "fabrication process" and "manufacturing process" may be considered equivalent, along with respective variants of the terms (e.g., "fabrication line" and "manufacturing line", "fabricator" and "manufacturer", or the like), for purposes of the present disclosure.

In some embodiments, the system 700 includes the Electrical Test subsystem 106 for testing the functionality of one or more portions of a manufactured device. For example, the Electrical Test subsystem 106 may be configured to generate the test data 108. It is noted herein the sample 704 may be moved from the Semiconductor Fab Characterization subsystem 102 to the Electrical Test subsystem 106 following completion of the fabrication of the sample 704.

In one non-limiting example, the Electrical Test subsystem 106 may include any number or type of electrical test tools 710 to complete a preliminary probing at a wafer level. For example, the preliminary probing may not be designed to try to force a failure at the wafer level.

In another non-limiting example, the Electrical Test subsystem 106 may include any number or type of stress test tools 712 to test, inspect, or otherwise characterize the properties of one or more portions of a fabricated device at any point in the manufacturing cycle. For example, the stress test tool 712 may include, but is not limited to, a pre-burn-in electrical wafer sort and final test (e.g., an e-test) or a post-burn-in electrical test configured to heat the sample 704 (e.g., an oven or other heat source), cool the sample 704 (e.g., a freezer or other cold source), operate the sample 704 at an incorrect voltage (e.g., a power supply), or the like.

In some embodiments, defects are identified using any combination of the Semiconductor Fab Characterization subsystem 102 (e.g., inspection tools 702, metrology tools 706, or the like), the Electrical Test subsystem 106 (e.g., including electrical test tools 710 and/or stress test tools 712, or the like), which are utilized before or after one or more processing steps (e.g., lithography, etching, aligning, joining, or the like) performed by one or more process tools 708 for layers of interest in the semiconductor dies and/or semiconductor die packages. In this regard, the defect detection at various stages of the manufacturing process may be referred to as inline defect detection.

In some embodiments, the system 700 includes a controller 714. The controller 714 may be communicatively coupled with any of the components of the system 700 including, but not limited to, the Semiconductor Fab Characterization subsystems 102 (e.g., including the inspection tools 702 or the metrology tools 706), the Electrical Test subsystems 106 (e.g., including the electrical test tools 710 or the stress test tools 712), or the like. It is noted herein the embodiments illustrated in FIG. 7A and the embodiments illustrated in FIG. 7B may be considered parts of the same system 700 or parts of a different system 700, for purposes of the present disclosure. In addition, it is noted herein components within the system 700 illustrated in FIG. 7A and components within the system 700 illustrated in FIG. 7B may be in direct communication or may communicate through the controller 714.

The controller 714 may include one or more processors 716 configured to execute program instructions maintained on memory 718 (e.g., a memory medium, memory device, or the like). The controller 714 may be configured to perform one or all of the steps of the method or process 200, the method or process 500, and/or a method or process 800 (e.g., as described throughout the present disclosure). In this regard, the subsystems 110, 402, and/or 408 may be stored in and/or configured to be performed by the controller 714. It is noted herein, however, the subsystems 110, 402, and/or 408 may be separate from the controller 714 and configured to be in communication with the controller 714 (e.g., either directly or through a server or controller communicatively coupled to the controller 714, where the server or controller may include processors and memory, and other communicatively-coupled components as described throughout the present disclosure).

The one or more processors 716 may include any processor or processing element known in the art. For the purposes of the present disclosure, the term "processor" or "processing element" may be broadly defined to encompass any device having one or more processing or logic elements (e.g., one or more graphics processing units (GPU), micro-processing units (MPU), systems-on-a-chip (SoC), one or more application specific integrated circuit (ASIC) devices, one or more field programmable gate arrays (FPGAs), or one or more digital signal processors (DSPs)). In this sense, the one or more processors 716 may include any device configured to execute algorithms and/or instructions (e.g., program instructions stored in memory). In one embodiment, the one or more processors 716 may be embodied as a desktop computer, mainframe computer system, workstation, image computer, parallel processor, networked computer, or any other computer system configured to execute a program configured to operate or operate in conjunction with components of the systems 100, 400, and/or 700, as described throughout the present disclosure.

The memory 718 may include any storage medium known in the art suitable for storing program instructions executable by the associated respective one or more processors 716. For example, the memory 718 may include a non-transitory memory medium. By way of another example, the memory 718 may include, but is not limited to, a read-only memory (ROM), a random-access memory (RAM), a magnetic or optical memory device (e.g., disk), a magnetic tape, a solid-state drive and the like. It is further noted that the memory 718 may be housed in a common controller housing with the one or more processors 716. In one embodiment, the memory 718 may be located remotely with respect to the physical location of the respective one or more processors 716. For instance, the respective one or more processors 716 may access a remote memory (e.g., server), accessible through a network (e.g., internet, intranet, and the like).

In another embodiment, the system 700 includes a user interface 720 coupled (e.g., physically coupled, electrically coupled, communicatively coupled, or the like) to the controller 714. For example, the user interface 720 may be a separate device coupled to the controller 714. By way of another example, the user interface 720 and the controller 714 may be located within a common or shared housing. It is noted herein, however, the controller 714 may not include, require, or be coupled to the user interface 720.

The user interface 720 may include, but is not limited to, one or more desktops, laptops, tablets, and the like. The user interface 720 may include a display used to display data of the systems 100, 400, and/or 700 to a user. The display of the user interface 720 may include any display known in the art. For example, the display may include, but is not limited to, a liquid crystal display (LCD), an organic light-emitting diode (OLED) based display, or a CRT display. Those skilled in the art should recognize that any display device capable of integration with the user interface 720 is suitable for implementation in the present disclosure. In another embodiment, a user may input selections and/or instructions responsive to data displayed to the user via a user input device of the user interface 720.

It is noted herein one or more of the systems 100, 400, 700 may be configured to operate with an electronic chip identification (ID) tag, marker, designator, or the like. For example, the electronic chip ID may be assigned to facilitate correlation of wafer-based bin data, characterization data (e.g., inline defect inspection data and/or metrology data), packaged test data, or the like.

Figure 8:
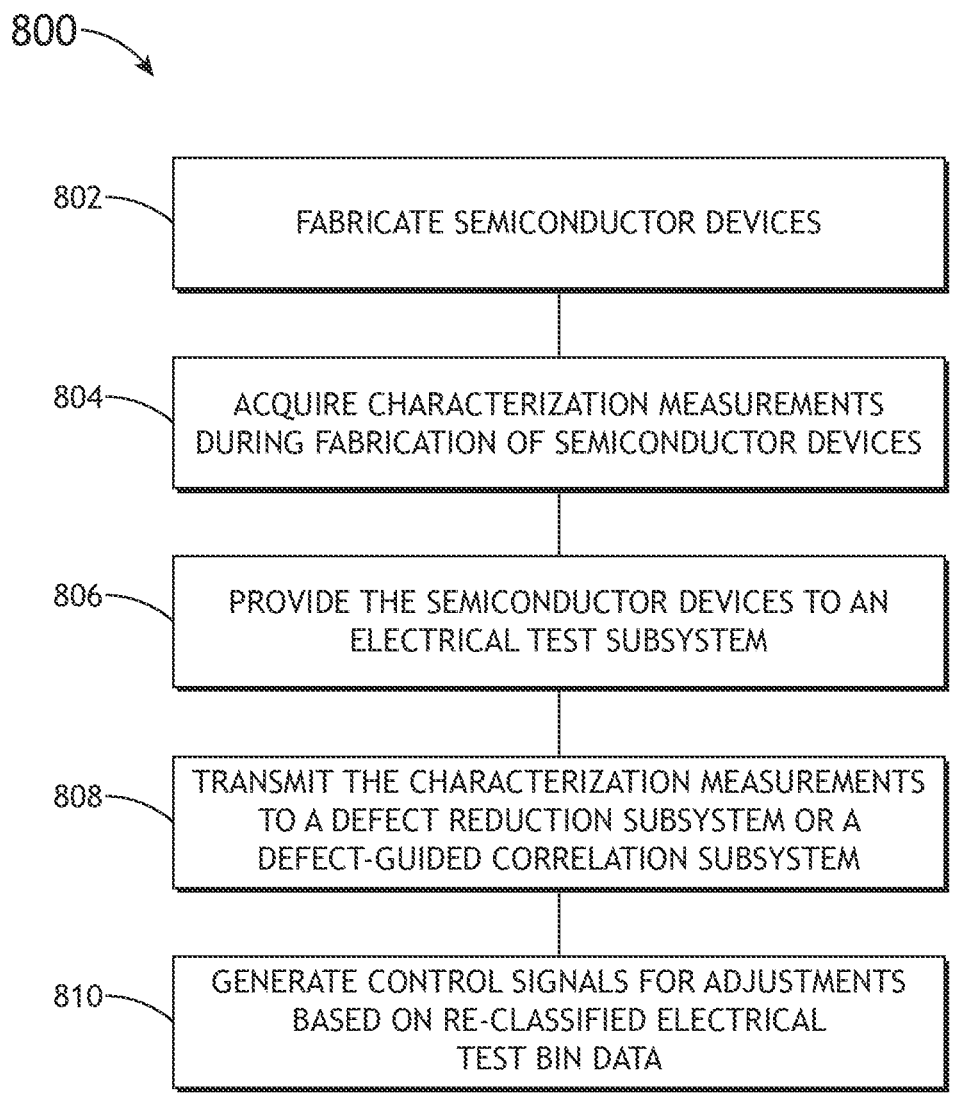
FIG. 8 is a flow diagram illustrating steps performed in a method or process for fabricating, characterizing, and/or testing of semiconductor devices, in accordance with one or more embodiments of the present disclosure.

FIG. 8 illustrates a method or process 800 illustrating steps for fabricating, characterizing, and/or testing of semiconductor devices, in accordance with one or more embodiments of the present disclosure. It is noted herein that the steps of method or process 800 may be implemented all or in part by the system 700 illustrated in FIGS. 7A and 7B. It is further recognized, however, that the method or process 800 is not limited to the system 700 illustrated in FIGS. 7A and 7B in that additional or alternative system-level embodiments may carry out all or part of the steps of method or process 800.

In a step 802, semiconductor devices are fabricated. In some embodiments, the semiconductor devices (e.g., wafers 104) are fabricated via a plurality of semiconductor fabrication processes. For example, the Semiconductor Fab Characterization subsystem 102 may include, but is not limited to, one or more process tools 708 configured to manufacture semiconductor devices including 1, 2, . . . N number of layers fabricated following a number (e.g., tens, hundreds, thousands) of steps performed by a number of semiconductor fabrication processes.

In a step 804, characterization measurements are acquired during fabrication of semiconductor devices. In some embodiments, the characterization measurements are acquired by the Semiconductor Fab Characterization subsystem 102. For example, characterization measurements may be performed by a plurality of characterization tools (e.g., inspection tools 702 and/or metrology tools 706) during (e.g., before steps, between steps, and/or after steps of) the fabrication of the one or more semiconductor devices (e.g., the wafers 104) via the plurality of semiconductor fabrication processes performed by the plurality of process tools 708.

In a step 806, the semiconductor devices are provided to an Electrical Test subsystem. In some embodiments, the Electrical Test subsystem 106 receives the lot of wafers 104. For example, the Electrical Test subsystem 106 may perform electrical tests and/or stress tests to generate the test data 108.

In a step 808, the characterization measurements are transmitted to a Defect Reduction subsystem or a Defect-Guided Correlation subsystem. In some embodiments, the system 700 is configured to overlay characterization data 404 and/or filtered characterization data 406 onto the electrical test bin data 112 via one or more steps of the method or process 500. For example, the Defect Reduction subsystem 402 may be configured to receive characterization data 404 and generate filtered characterization data 406 via one or more steps of the method or process 500 (e.g., as performed by one or more components of the system 400). By way of another example, the Defect-Guided Correlation subsystem 408 may be configured to receive the characterization data 404 and/or the filtered characterization data 406. The Defect-Guided Correlation subsystem 408 may be configured to overlay characterization data 404 and/or filtered characterization data 406 onto the electrical test bin data 112.

In a step 810, control signals for adjustments are generated based on re-classified electrical test bin data. In some embodiments, following the overlay characterization data 404 and/or filtered characterization data 406 onto the electrical test bin data 112, at least some of the electrical test bin data 112 is re-classified by the Defect-Guided Correlation subsystem 408. In addition, defects may be newly found by the Defect-Guided Correlation subsystem 408 based on the overlay. It is noted herein one or more adjustments may be determined for at least one of the fabricating, characterizing, and/or testing of the semiconductor devices based on the re-classification of the electrical test bin data 112 and/or defects newly-found during the performing of the methods or processes 500 or 800. For example, the one or more adjustments may modify fabrication processes or methods, characterization processes or methods, test processes or methods, or the like provided in a feedback loop to components within the Semiconductor Fab Characterization subsystem 102. For instance, the fabrication processes or methods, characterization processes or methods, test processes or methods, or the like may be adjusted (e.g., via one or more control signals) based on the re-classification of the electrical test bin data 112 and/or defects newly-found during the performing of the methods or processes 500 or 800.

The adjustments are transmitted via a feedback loop (e.g., to adjust future semiconductor devices). The control signals may adjust components of the systems 100 or 400 and corresponding methods or processes based on the re-classified electrical test bin data 112. For example, the improvements may be directed to adjusting one or more components of the system 100 and/or steps of the method or process 200. For instance, the improvements may be directed to adjusting one or more components of the Semiconductor Fab Characterization subsystem 102. By way of another example, the improvements may be directed to adjusting one or more components of the system 400 and/or steps of the method or process 500. In this regard, the fabrication and/or characterization processes may be improved, leading to a reduction in cost (e.g., in time, money, or the like) for fabricators while maintaining a desired level of quality (e.g., PPB failure rates).

It is noted herein the methods or processes 200, 500, and 800 are not limited to the steps and/or sub-steps provided. The methods or processes 200, 500, and 800 may include more or fewer steps and/or sub-steps. The methods or processes 200, 500, and 800 may perform the steps and/or sub-steps simultaneously. The methods or processes 200, 500, and 800 may perform the steps and/or sub-steps sequentially, including in the order provided or an order other than provided. Therefore, the above description should not be interpreted as a limitation on the scope of the present disclosure but merely an illustration.

In one non-limiting example of the systems and methods described throughout the present disclosure, for reliability sensitive devices the Semiconductor Fab Characterization subsystem 102 may initiate screening inspections at 4-8 critical inspection steps to obtain characterization data 404, the screening inspections being performed on every die of every wafer 104 of every lot for the given semiconductor device. The characterization data 404 may be automatically forwarded to the fab-wide Defect Management subsystem 414 and/or the Defect Reduction subsystem 402 (e.g., I-PAT Analyzer, or the like), which may weigh and aggregate defectivity to arrive at a die-based defectivity score, where the die-based defectivity score is forwarded to the appropriate fab database as filtered characterization data 406.

After completion of fab processing, the wafers 104 may undergo wafer sort electrical testing and singulation via the Electrical Test subsystem 106. Post singulation, the die are packaged and undergo a number of electrical and stress tests to generate test data 108. Following all testing, statistical outlier algorithms are applied to the test data 108 (e.g., including, but not limited to, Z-PAT) by the Statistical Outlier Detection subsystem 110. When instances of Z-PAT outliers are identified by the Statistical Outlier Detection subsystem 110, electrical test bin data 112 for the corresponding die will be sent to the Defect-Guided Correlation subsystem 408 for analysis.

The Defect-Guided Correlation subsystem 408 may overlay the electrical test bin data 112 with the characterization data 404 and/or filtered characterization data 406. Based on the overlay, the Defect-Guided Correlation subsystem 408 may determine whether defects were correctly found by the Electrical Test subsystem 106 in electrically-failing die 304 on the wafers 104, whether the Electrical Test subsystem 106 missed defects on select wafers 104 by declaring the corresponding die to be good die 302, or whether the Electrical Test subsystem 106 incorrectly characterized wafers 104 as having presumed electrically-failing die 306. The Defect-Guided Correlation subsystem 408 may determine whether or not inking out die is merited, and provide that information to relevant parties (e.g., as improved electrical die bin data 410) or to at least the Statistical Outlier Detection subsystem 110 (e.g., as re-classified electrical die bin data 412).

In this regard, the systems and methods of the present disclosure may provide increased sampling (e.g., 100% inspection of all wafers in all lots, as opposed to 10% inspection of lots at three wafers/lot, or other subset of wafers and lots) while improving electrical testing and/or defect testing through identification of potential reliability and/or test gap defects. The systems and methods of the present disclosure may provide improved insight that will help enable automotive semiconductor device manufacturers to reduce reliability failures from the PPM to PPB range. Semiconductor failures are the number one failure item for automobile manufacturing, and the issue will become more intense as the semiconductor content for automobiles grows (e.g., with the implementation of autonomous driving and electric vehicles). Similarly, reliability concerns are also becoming increasingly important in industrial, biomedical, defense, aerospace, hyper-scale data centers, and the like. Identifying test coverage gaps will create awareness of the limitation of electrical test methods, and therefore drive the adoption of inline defect screening inspections to mitigate these problems.

Advantages of the present disclosure are directed to a system and method for Z-PAT defect-guided statistical outlier detection of semiconductor reliability failures. Advantages of the present disclosure are also directed to identification of Z-PAT defect signatures representing potential reliability and/or test gap defects at the same x, y position on multiple wafers within a lot using characterization data (e.g., inline defect inspection data and/or metrology data). Advantages of the present disclosure are also directed to identification of Z-PAT defect signatures using statistical outlier algorithms. Advantages of the present disclosure are also directed to automatic notification to fab engineers of the presence of new Z-PAT defect signatures. Advantages of the present disclosure are also directed to characterization of Z-PAT defect signatures using spatial signature analysis methods. Advantages of the present disclosure are also directed to characterization of Z-PAT defect signatures using machine learning methods. Advantages of the present disclosure are also directed to identification of the presence or non-presence of Z-PAT defect signatures within a given lot. Advantages of the present disclosure are also directed to identification of Z-PAT defect signatures on adjacent lots. Advantages of the present disclosure are also directed to identification of Z-PAT defect signatures which are undetected by electrical test-based Z-PAT. Advantages of the present disclosure are also directed to reduction in overkill by using Z-PAT defect signatures to more precisely bound the extent of the impacted die/wafers. Advantages of the present disclosure are also directed to rapid identification of underlying root cause based on learning from previously characterized Z-PAT defect signatures. Advantages of the present disclosure are also directed to retroactive identification of Z-PAT defect signatures to direct warranty and/or recall efforts using stored inline defect data.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A system comprising:
 a controller communicatively coupled to at least a semiconductor fab characterization subsystem, wherein the controller includes one or more processors configured to execute program instructions causing the one or more processors to:
  receive electrical test bin data via a defect-guided correlation subsystem, wherein the electrical test bin data includes semiconductor die data for a plurality of wafers in a lot, wherein the electrical test bin data is generated by a statistical outlier detection subsystem configured to perform Z-direction Part Average Testing (Z-PAT) on test data, wherein an electrical test subsystem is configured to generate the test data by testing the plurality of wafers in the lot after fabrication by the semiconductor fab characterization subsystem;

receive characterization data via the defect-guided correlation subsystem, wherein the characterization data for the plurality of wafers in the lot is generated by the semiconductor fab characterization subsystem during the fabrication of the plurality of wafers in the lot;

determine a statistical correlation between the electrical test bin data and the characterization data via the defect-guided correlation subsystem at a same x, y position on each of the plurality of wafers in the lot; and locate defect data signatures on the plurality of wafers in the lot based on the statistical correlation via the defect-guided correlation subsystem.

2. The system of claim 1, wherein the one or more processors are further configured to execute program instructions causing the one or more processors to:

process the characterization data via a defect reduction subsystem to generate a subset of characterization data as filtered characterization data, wherein the defect reduction subsystem is configured to perform Inline Defect Part Average Testing (I-PAT), wherein the defect reduction subsystem is configured to generate the filtered characterization data by performing I-PAT on the characterization data prior to the defect-guided correlation subsystem receiving the filtered characterization data.

3. The system of claim 1, wherein the one or more processors are further configured to execute program instructions causing the one or more processors to:

overlay the characterization data on the electrical test bin data to determine the statistical correlation between the electrical test bin data and the characterization data via the defect-guided correlation subsystem, wherein the overlay of the characterization data on the electrical test bin data occurs at the same x, y position on each of the plurality of wafers in the lot.

4. The system of claim 1, wherein the one or more processors are further configured to execute program instructions causing the one or more processors to:

re-classify at least some semiconductor die data in the electrical test bin data based on the defect data signatures via the defect-guided correlation subsystem.

5. The system of claim 4, wherein the at least some semiconductor die data is re-classified as either being a good die, as being a known electrically-failing die, or as being a potentially electrically-failing die.

6. The system of claim 5, wherein the one or more processors are further configured to execute program instructions causing the one or more processors to:

transmit the re-classified semiconductor die data as improved electrical test bin data via the defect-guided correlation subsystem, wherein the improved electrical test bin data includes one or more recommendations for inking out semiconductor die data re-classified as either being the good die or the potentially electrically-failing die on select wafers of the plurality of wafers in the lot having the same x, y position as the known electrically-failing die on other wafers of the plurality of wafers in the lot.

7. The system of claim 6, wherein the one or more processors are further configured to execute program instructions causing the one or more processors to:

transmit the re-classified semiconductor die data to the statistical outlier detection subsystem via the defect-guided correlation subsystem.

8. The system of claim 4, wherein the one or more processors are further configured to execute program instructions causing the one or more processors to:

determine one or more adjustments to at least one of the fabricating, characterizing, and/or testing of a subsequent plurality of wafers in a subsequent lot based on the re-classified semiconductor die data in the electrical test bin data.

9. The system of claim 8, wherein the one or more processors are further configured to execute program instructions causing the one or more processors to:

generate one or more control signals based on the one or more adjustments to at least one of the fabricating, characterizing, and/or testing of the subsequent plurality of wafers in the subsequent lot.

10. The system of claim 1, wherein the controller is communicatively coupled to the electrical test subsystem.

11. A method comprising:

receiving electrical test bin data via a defect-guided correlation subsystem, wherein the electrical test bin data includes semiconductor die data for a plurality of wafers in a lot, wherein the electrical test bin data is generated by a statistical outlier detection subsystem configured to perform Z-direction Part Average Testing (Z-PAT) on test data, wherein an electrical test subsystem is configured to generate the test data by testing the plurality of wafers in the lot after fabrication by a semiconductor fab characterization subsystem;

receiving characterization data via the defect-guided correlation subsystem, wherein the characterization data for the plurality of wafers in the lot is generated by the semiconductor fab characterization subsystem during the fabrication of the plurality of wafers in the lot;

determining a statistical correlation between the electrical test bin data and the characterization data via the defect-guided correlation subsystem at a same x, y position on each of the plurality of wafers in the lot; and locating defect data signatures on the plurality of wafers in the lot based on the statistical correlation via the defect-guided correlation subsystem.

12. The method of claim 11, further comprising:

processing the characterization data via a defect reduction subsystem to generate a subset of characterization data as filtered characterization data, wherein the defect reduction subsystem is configured to perform Inline Defect Part Average Testing (I-PAT), wherein the defect reduction subsystem is configured to generate the filtered characterization data by performing I-PAT on the characterization data prior to the defect-guided correlation subsystem receiving the filtered characterization data.

13. The method of claim 11, further comprising:

overlaying the characterization data on the electrical test bin data to determine the statistical correlation between the electrical test bin data and the characterization data via the defect-guided correlation subsystem, wherein the overlay of the characterization data on the electrical test bin data occurs at the same x, y position on each of the plurality of wafers in the lot.

14. The method of claim 11, further comprising:

re-classifying at least some semiconductor die data in the electrical test bin data based on the defect data signatures via the defect-guided correlation subsystem.

15. The method of claim 14, wherein the at least some semiconductor die data is re-classified as either being a good die, as being a known electrically-failing die, or as being a potentially electrically-failing die.

16. The method of claim 15, further comprising:
transmitting the re-classified semiconductor die data as improved electrical test bin data via the defect-guided correlation subsystem, wherein the improved electrical test bin data includes one or more recommendations for inking out semiconductor die data re-classified as either being the good die or the potentially electrically-failing die on select wafers of the plurality of wafers in the lot having the same x, y position as the known electrically-failing die on other wafers of the plurality of wafers in the lot.

17. The method of claim 16, further comprising:
transmitting the re-classified semiconductor die data to the statistical outlier detection subsystem via the defect-guided correlation subsystem.

18. The method of claim 14, further comprising:
determining one or more adjustments to at least one of the fabricating, characterizing, and/or testing of a subsequent plurality of wafers in a subsequent lot based on the re-classified semiconductor die data in the electrical test bin data.

19. The method of claim 18, further comprising:
generating one or more control signals based on the one or more adjustments to at least one of the fabricating, characterizing, and/or testing of the subsequent plurality of wafers in the subsequent lot.

20. A system comprising:
a semiconductor fab characterization subsystem, wherein the semiconductor fab characterization subsystem is configured to fabricate a plurality of wafers in a lot, wherein the semiconductor fab characterization subsystem is configured to generate characterization data for the plurality of wafers in the lot during the fabrication of the plurality of wafers in the lot;
an electrical test subsystem, wherein the test characterization subsystem is configured to generate test data for the plurality of wafers in the lot after fabrication by the semiconductor fab characterization subsystem; and
a controller communicatively coupled to at least the semiconductor fab characterization subsystem, wherein the controller includes one or more processors configured to execute program instructions causing the one or more processors to:
receive electrical test bin data via a defect-guided correlation subsystem, wherein the electrical test bin data includes semiconductor die data for the plurality of wafers in the lot, wherein the electrical test bin data is generated by a statistical outlier detection subsystem configured to perform Z-direction Part Average Testing (Z-PAT);
receive the characterization data via the defect-guided correlation subsystem;
determine a statistical correlation between the electrical test bin data and the characterization data via the defect-guided correlation subsystem at a same x, y position on each of the plurality of wafers in the lot; and
locate defect data signatures on the plurality of wafers in the lot based on the statistical correlation via the defect-guided correlation subsystem.

21. The system of claim 20, wherein the one or more processors are further configured to execute program instructions causing the one or more processors to:
process the characterization data via a defect reduction subsystem to generate a subset of characterization data as filtered characterization data, wherein the defect reduction subsystem is configured to perform Inline Defect Part Average Testing (I-PAT), wherein the defect reduction subsystem is configured to generate the filtered characterization data by performing I-PAT on the characterization data prior to the defect-guided correlation subsystem receiving the filtered characterization data.

22. The system of claim 20, wherein the one or more processors are further configured to execute program instructions causing the one or more processors to:
overlay the characterization data on the electrical test bin data to determine the statistical correlation between the electrical test bin data and the characterization data via the defect-guided correlation subsystem, wherein the overlay of the characterization data on the electrical test bin data occurs at the same x, y position on each of the plurality of wafers in the lot.

23. The system of claim 20, wherein the one or more processors are further configured to execute program instructions causing the one or more processors to:
re-classify at least some semiconductor die data in the electrical test bin data based on the defect data signatures via the defect-guided correlation subsystem.

24. The system of claim 23, wherein the at least some semiconductor die data is re-classified as either being a good die, as being a known electrically-failing die, or as being a potentially electrically-failing die.

25. The system of claim 24, wherein the one or more processors are further configured to execute program instructions causing the one or more processors to:
transmit the re-classified semiconductor die data as improved electrical test bin data via the defect-guided correlation subsystem, wherein the improved electrical test bin data includes one or more recommendations for inking out semiconductor die data re-classified as either being the good die or the potentially electrically-failing die on select wafers of the plurality of wafers in the lot having the same x, y position as the known electrically-failing die on other wafers of the plurality of wafers in the lot.

26. The system of claim 25, wherein the one or more processors are further configured to execute program instructions causing the one or more processors to:
transmit the re-classified semiconductor die data to the statistical outlier detection subsystem via the defect-guided correlation subsystem.

27. The system of claim 23, wherein the one or more processors are further configured to execute program instructions causing the one or more processors to:
determine one or more adjustments to at least one of the fabricating, characterizing, and/or testing of a subsequent plurality of wafers in a subsequent lot based on the re-classified semiconductor die data in the electrical test bin data.

28. The system of claim 27, wherein the one or more processors are further configured to execute program instructions causing the one or more processors to:
generate one or more control signals based on the one or more adjustments to at least one of the fabricating, characterizing, and/or testing of the subsequent plurality of wafers in the subsequent lot.

29. The system of claim 20, wherein the controller is communicatively coupled to the electrical test subsystem.

* * * * *